(12) United States Patent
Wood

(10) Patent No.: US 7,978,012 B2
(45) Date of Patent: Jul. 12, 2011

(54) DUAL PLL LOOP FOR PHASE NOISE FILTERING

(75) Inventor: John Wood, Wellingborough (GB)

(73) Assignee: Multigig Inc., San Jose, CA (US)

( * ) Notice: Subject to any disclaimer, the term of this patent is extended or adjusted under 35 U.S.C. 154(b) by 0 days.

(21) Appl. No.: 11/945,234

(22) Filed: Nov. 26, 2007

(65) Prior Publication Data

US 2008/0265998 A1   Oct. 30, 2008

Related U.S. Application Data

(63) Continuation of application No. 11/689,399, filed on Mar. 21, 2007, now abandoned.

(60) Provisional application No. 60/743,625, filed on Mar. 21, 2006.

(51) Int. Cl.
*H03L 7/00* (2006.01)

(52) U.S. Cl. .................. 331/2; 331/1 A; 331/11; 331/45; 331/46

(58) Field of Classification Search .................. 331/1 A, 331/16, 44, 45, 2, 11, 46, 47
See application file for complete search history.

(56) References Cited

U.S. PATENT DOCUMENTS

| | | | |
|---|---|---|---|
| 5,194,828 A | 3/1993 | Kato et al. | |
| 5,584,067 A | 12/1996 | Buer et al. | |
| 5,717,730 A | 2/1998 | Prakash et al. | |
| 5,977,805 A * | 11/1999 | Vergnes et al. | 327/107 |
| 6,115,586 A * | 9/2000 | Bezzam et al. | 455/112 |
| 6,259,327 B1 | 7/2001 | Balistreri | |
| 6,310,498 B1 * | 10/2001 | Larsson | 327/158 |
| 6,512,408 B2 | 1/2003 | Lee et al. | |
| 6,670,833 B2 | 12/2003 | Kurd et al. | |
| 6,686,784 B2 * | 2/2004 | Chang | 327/157 |
| 6,812,797 B1 | 11/2004 | De Veirman et al. | |
| 6,895,525 B1 | 5/2005 | Wilkie et al. | |
| 6,920,622 B1 | 7/2005 | Garlepp et al. | |
| 6,927,638 B2 | 8/2005 | Glenn | |
| 6,952,124 B2 * | 10/2005 | Pham | 327/156 |
| 7,042,253 B2 * | 5/2006 | Su et al. | 327/17 |
| 7,173,462 B1 * | 2/2007 | Wang | 327/158 |
| 2004/0212410 A1 * | 10/2004 | Ghazali et al. | 327/156 |
| 2005/0013396 A1 * | 1/2005 | Kliesner et al. | 375/372 |
| 2005/0168291 A1 | 8/2005 | Karlsson | |
| 2005/0186918 A1 * | 8/2005 | Ramet et al. | 455/76 |
| 2006/0071844 A1 | 4/2006 | Wood | |
| 2006/0250170 A1 * | 11/2006 | Wang | 327/156 |

(Continued)

OTHER PUBLICATIONS

PCT International Search Report from PCT/US07/64564 dated Feb. 11, 2008. Written Opinion of IPEA regarding PCT/US07/64564, Nov. 13, 2009.
An All-Digital Phase-Locked Loop with 50-Cycle Lock Time Suitable for High-Performance Microprocessors, Dunning, Garcia, Lundberg, Nuckolls, Apr. 1995.
Preliminary Report on Patentability (PCT Rule 44bis) Sep. 23, 2008. Written Opinion Feb. 8, 2008.

* cited by examiner

*Primary Examiner* — Joseph Chang
*Assistant Examiner* — Jeffrey Shin
(74) *Attorney, Agent, or Firm* — IPxLaw Group LLP

(57) ABSTRACT

System for filtering an input frequency to produce an output frequency having low phase noise. A first PLL includes, in the feedback path, a frequency translation circuit which translates a frequency from a VCO in the first PLL by an offset frequency provided by the second PLL to provide either a sum or difference frequency. The first PLL locks its VCO to a crystal oscillator input frequency translated by the offset frequency due to the frequency translation circuit. A second PLL compares the input frequency to be filtered to the output of the first PLL VCO. The second PLL causes the first PLL VCO to lock to the input frequency by varying the offset frequency it provides to the frequency translation circuit. The bandwidth of the second PLL is significantly smaller than the bandwidth of the first PLL. The filtered output frequency is available from the first PLL VCO.

24 Claims, 27 Drawing Sheets

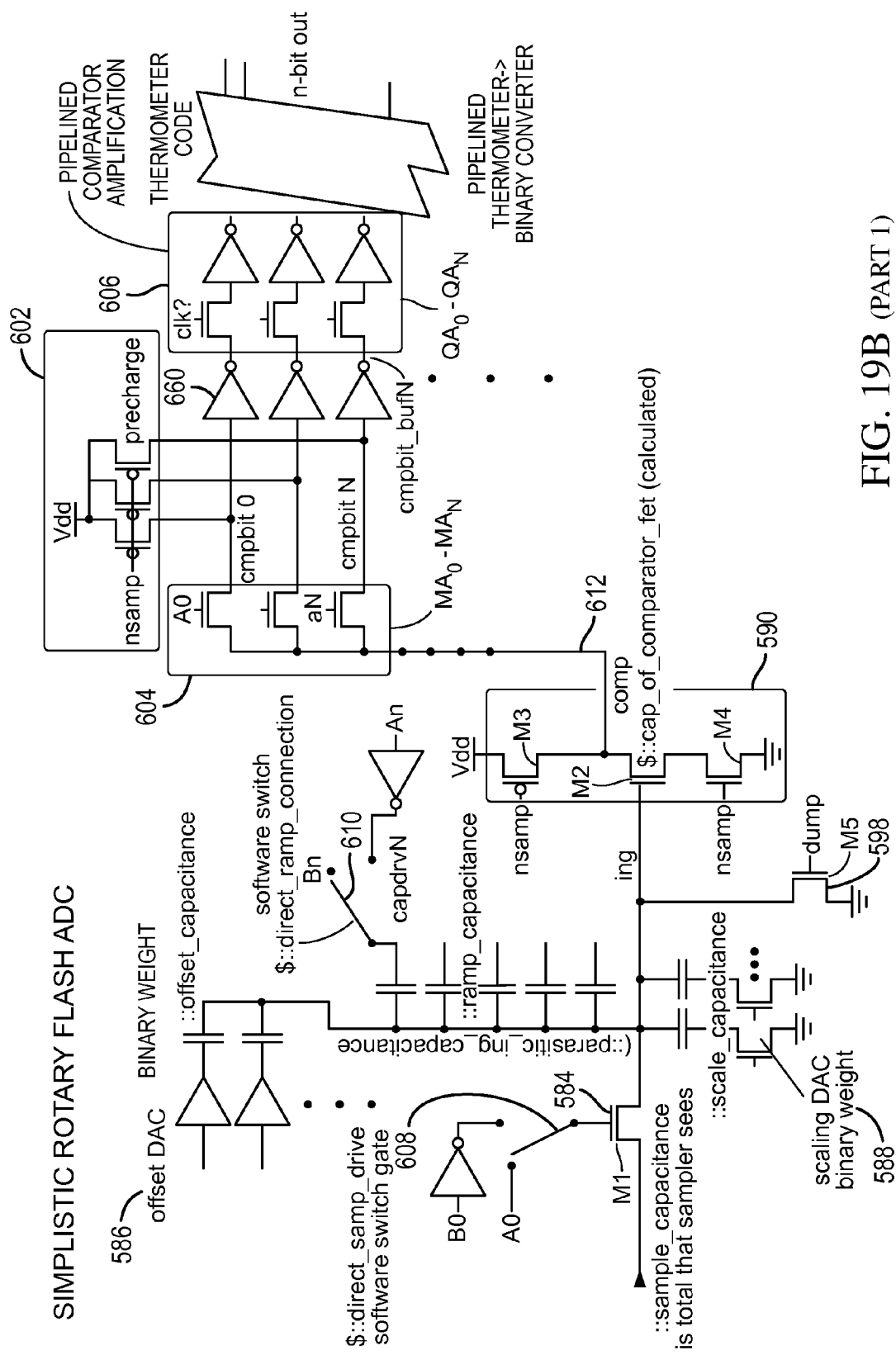
FIG. 19B (PART 1)

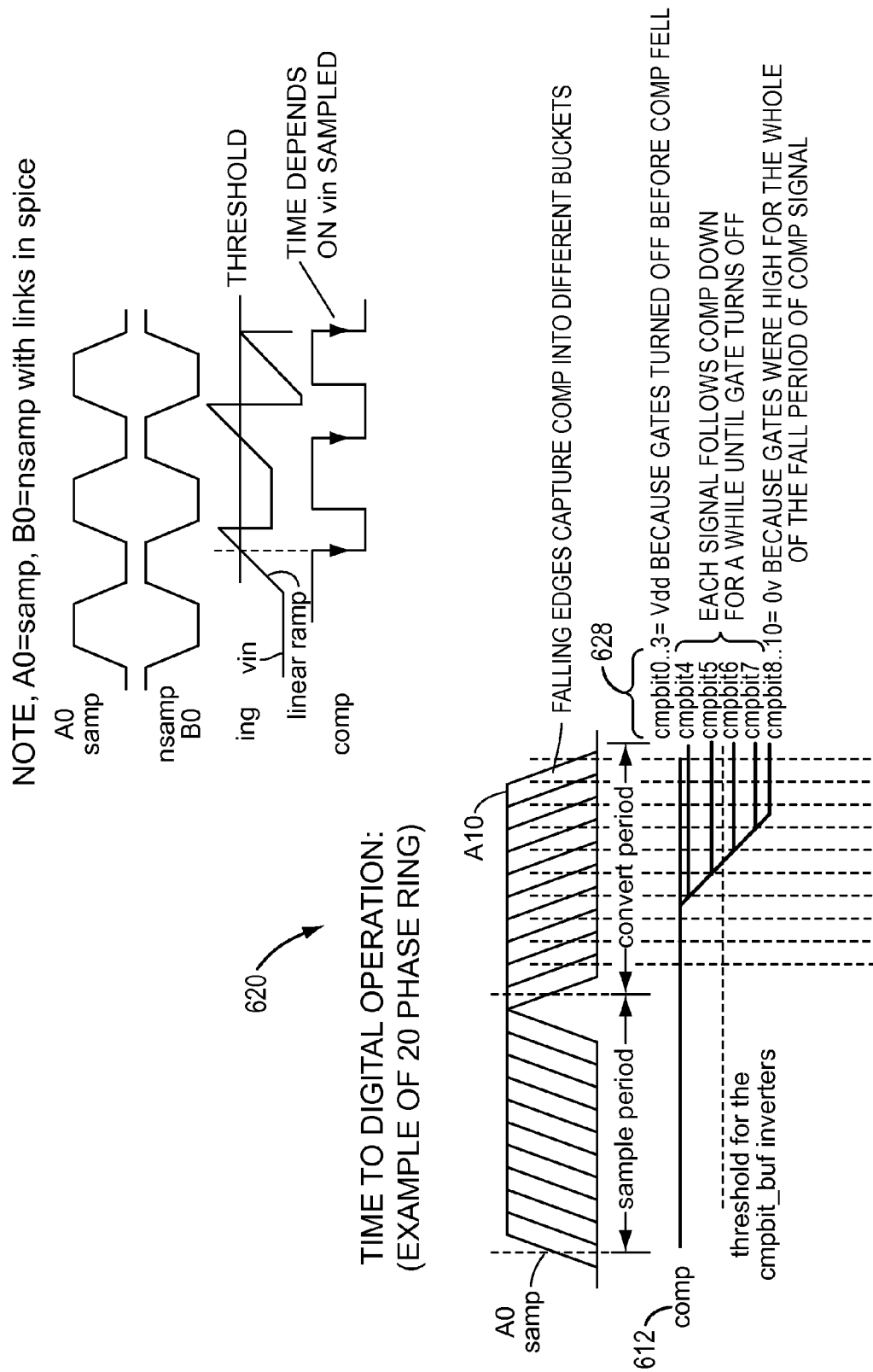
FIG. 19B (PART 2)

DUAL PLL LOOP FOR PHASE NOISE FILTERING

CROSS REFERENCE TO RELATED APPLICATION

This application claims priority to U.S. patent application Ser. No. 11/689,399, filed Mar. 21, 2007, and titled "DUAL PLL LOOP FOR PHASE NOISE FILTERING," which claims priority to U.S. Provisional Application Ser. No. 60/743,625, filed Mar. 21, 2006, and titled "DUAL PLL LOOP FOR PHASE NOISE FILTERING" both applications referred to above being incorporated by reference herein.

FIELD OF THE INVENTION

The present invention relates generally to PLLs and more particularly to low phase noise PLLS.

DESCRIPTION OF THE RELATED ART

Oscillators can be rated by their phase noise and tunability characteristics. Shown in the table are the data for a crystal oscillator, a ring oscillator, an LC oscillator, and a rotary oscillator.

| Oscillator Type | Close-In noise | Mid-range | Far-out noise | Tunability |
|---|---|---|---|---|
| crystal | excellent | excellent | poor | very small |
| ring oscillator | very poor | very poor | moderate | very large |
| LC oscillator | poor | moderate | very good | small |
| rotary oscillator | poor | moderate | excellent | large |

From the table, crystal oscillators exhibit the best characteristics and achieve these at very low power and cost. The weaknesses of crystals are their lack of wide tunability and the poor far-out phase noise performance. It would be desirable to have a frequency source with the characteristics of a crystal oscillator, but without the drawbacks of low tunability and poor far-out noise.

BRIEF SUMMARY OF THE INVENTION

An objective of the present invention is to combine the best properties of a quartz-crystal oscillator with the tunability, multiphase capability and good far-out phase noise characteristics of a rotary oscillator-divider system to provide a low noise frequency source. Rotary oscillators combined with a divider address the weaknesses mentioned previously.

One embodiment of the present invention is a circuit for filtering phase noise of an input frequency. The circuit includes a frequency translation means, first and second comparing means, first and second filtering means, a means for adjusting the generating means, and a means for providing a second frequency. The frequency translation means translates a first frequency to provide a translated frequency that is either a sum or difference of the first frequency and a second frequency in response to an ordered selection of the different phases of the oscillator signals by the second frequency. The first comparing means compares the sum or difference frequency to a reference frequency. The first filtering means filters the first comparing means. The adjusting means adjusts the frequency of the generating means in response to the first filtering means. The second comparing means compares one of said oscillator signals to the input frequency. The second filtering means filters the second comparing means. The providing means provides the second frequency adjustably responsive to said second filtering means.

Another embodiment of the present invention is a circuit for filtering phase noise of an input frequency. The circuit includes a multi-phase VCO, a frequency translation circuit, a first phase/frequency detector, a first phase/frequency detector, a first low pass filter, a control circuit, a second VCO, a second phase/frequency detector, and a second low pass filter. The multi-phase VCO is operative to provide a plurality of phase signals, each having the same frequency, with multi-phase VCO having a first frequency control input. The frequency translation circuit is operative to translate the frequency of the multi-phase VCO to provide on an output a translated frequency that is either a sum or difference of the first frequency and a second frequency. The first phase/frequency detector is operative to detect any difference in frequency or phase between a reference frequency and the translated frequency and provide an output indicating the detected difference. The first low pass filter is operative to filter the output of the first phase/frequency detector and provide at least one voltage indicating the filtered difference in frequency. The control circuit is operative to control the frequency and phase of the multi-phase VCO in response to the output from the low pass filter. The second VCO is operative to provide the second frequency in response to a second frequency control input. The second phase/frequency detector is operative to detect any difference in frequency or phase between the input frequency and the frequency of the multiphase VCO and provide an output indicating the detected difference. The second low pass filter is operative to filter the output of the second phase/frequency detector and control, via the second frequency control input, the frequency and phase of the second VCO. One of said phase signals is a filtered version of the input frequency.

Yet another embodiment of the present invention is a method of filtering phase noise of an input frequency. The method includes frequency and phase locking a translated frequency to a reference frequency having a first phase noise characteristic over a first bandwidth, wherein said translated frequency is either the sum or difference of a first frequency of a first oscillator having a plurality of phases and a second noise characteristic over a second bandwidth and a second frequency of a second oscillator, wherein said translated frequency is generated in response to an ordered selection of the different phases of the first oscillator by the second frequency, wherein one of the phase of the first oscillator is an output having substantially the first and second phase noise characteristics; and frequency and phase locking the input frequency to the filtered output of the first oscillator to set the frequency of the second oscillator.

As an example application, a SONET system clock or other similar reference clock may have accumulated a great deal of electrical noise which compromises the mid-range and far-out phase noise of the clock (say at 622 MHz for a SONET system). The final output of the present invention delivers a very clean clock signal with minimal close-in, mid-range and far-out phase noise resulting in sub-picosecond jitter. Total RMS jitter in this arrangement is expected to be about 130 fS.

BRIEF DESCRIPTION OF THE DRAWINGS

These and other features, aspects and advantages of the present invention will become better understood with regard to the following description, appended claims, and accompanying drawings where:

FIGS. 19A and 19B show a more complex implementation of an DC in accordance with an embodiment of the present invention.

DETAILED DESCRIPTION OF THE INVENTION

Figure 1A:
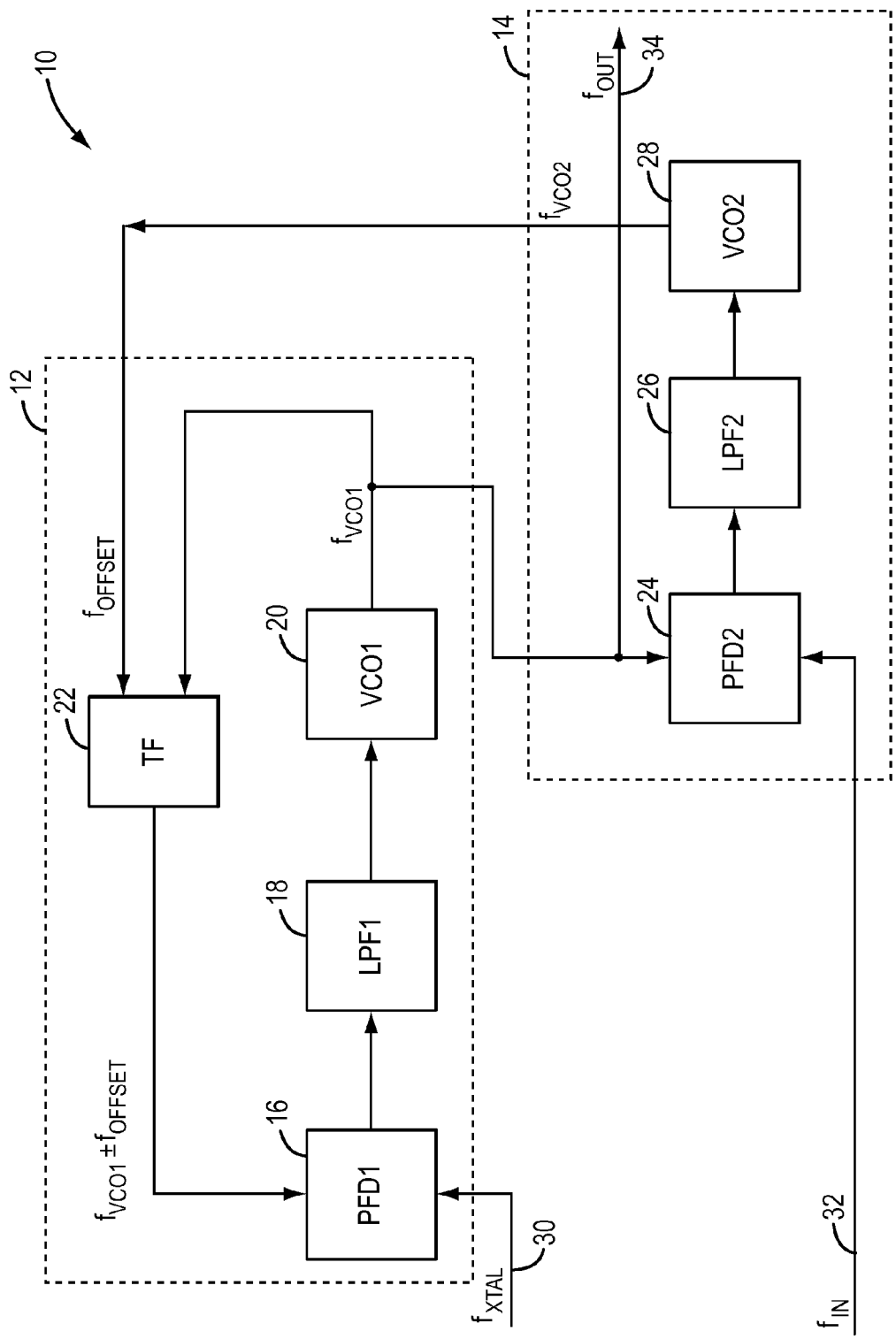
FIG. 1A shows a block diagram of the present invention without dividers.

FIG. 1A shows a block diagram of a system for tuning a crystal oscillator without dividers. The diagram includes a main PLL 12 and a secondary PLL 14. The main PLL includes a phase frequency detector PFD1 16, a loop filter LPF1 18, a voltage controlled oscillator VCO1 20, and a frequency translation circuit TF 22. The secondary PLL 14 includes a phase frequency detector PFD2 24, a loop filter LPF2 26, a voltage controlled oscillator VCO2 28. The inputs to the PFD1 16 are the output of the frequency translation circuit 22 and the frequency 30 from a reference frequency source, such as a crystal oscillator. The output of PFD1 16 drives the LPF1 18, which, in turn, controls, via a control input, the frequency of VCO1 20. The inputs to the frequency translation circuit 22 are the output $f_{VCO1}$ of VCO1 20 and $f_{OFFSET}$. The inputs of PFD2 24 are the input frequency to be filtered $f_{IN}$ 32 and the output of VCO1 20. The output of PFD2 24 drives LPF2 26 which in turn controls, via a control input, the frequency $f_{OFFSET}$ of VCO2 28. The output 34 of the system is the frequency provided to PFD2 24.

In operation, the main PLL 12, when locked without any input from the secondary PLL 14 (i.e., $f_{OFFSET}$ is zero), causes the output frequency $f_{OUT}$ to track the frequency $f_{XTAL}$ 30 of the crystal. However, when the secondary PLL 14 provides a non-zero offset frequency $f_{OFFSET}$ to the main PLL 12, the main PLL 12 alters the VCO1 20 frequency to lock the output of the frequency translation circuit 22 to the frequency of the reference source 30. In particular, when the frequency translation circuit 22 translates the frequency $f_{OUT}$ upwards by $f_{OFFSET}$, then VCO1 20 operates at $f_{XTAL}-f_{OFFSET}$. If the frequency translation circuit 22 translates the frequency $f_{VCO1}$ downwards by $f_{OFFSET}$, then VCO1 20 operates at $f_{XTAL}+f_{OFFSET}$. In either case, the output of the frequency translation circuit 22 is always $f_{XTAL}$, because VCO1 20 adjusts its frequency by the offset frequency. With VCO1 operating at the frequency $f_{XTAL}\pm f_{OFFSET}$, PFD2 24 compares that frequency to the frequency $f_{IN}$ 32. If there is any difference in frequency or phase at the output of PFD2 24, then the frequency of VCO2 28 is increased or decreased. A change in frequency of VCO2 28 then changes the frequency at the output of the frequency translation circuit 22, which causes the main PLL 12 to change the frequency of VCO1 20 to eliminate the difference. Thus, $f_{OUT}$ 34 tracks the changes in $f_{IN}$ 32 as well as the changes in $f_{XTAL}$ 30.

Figure 1B:
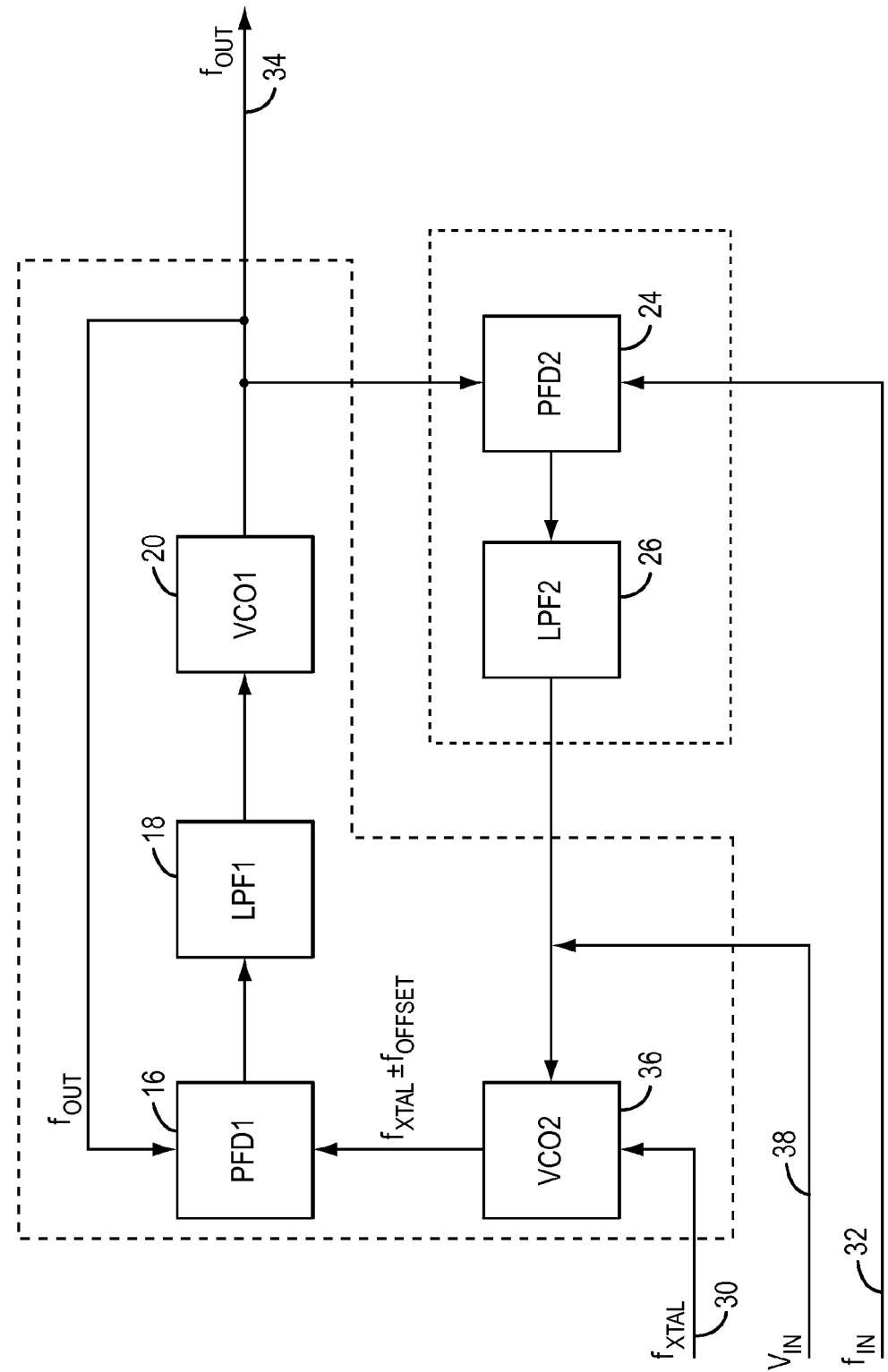
FIG. 1B shows an equivalent block diagram of the present invention.

Because VCO1 20 operates at $f_{XTAL}\pm f_{OFFSET}$, the system is equivalent to that shown in FIG. 1B. Essentially, translating the frequency of VCO1 by the frequency of VCO2 36 is equivalent to translating the frequency of the crystal oscillator by the frequency of VCO2 36. Because the offset frequency is adjustable (say, by means of dividers), the output $f_{OUT}$ is a tunable version of the crystal. As shown in the figure, tuning can be performed directly by a voltage input control 38 (no use of LPF2 and PFD2) or indirectly, when an input frequency is used to which the tunable version of the crystal locks. Note in FIGS. 1A and 1B that the frequency $f_{OUT}$ of the main PLL loop tracks $f_{IN}$ indirectly, that is, via the secondary PLL loop and the loop filters and dividers play an important role in the behavior of the PLLs.

Comparatively, loop filter LPF1 18 preferably has a much wider bandwidth (e.g., 1 MHz) than LPF2 26 (e.g., 1 KHz). This has the effect that the secondary PLL 14 filters out (is not responsive to) high frequency changes in $f_{IN}$ 32. Only very slow frequency changes are permitted to be tracked by the secondary PLL 14. However, $f_{IN}$ 32 has very low phase noise within the bandwidth of LPF2 26, so that the offset frequency provided by VCO2 28 is very stable in this bandwidth, essentially having the close-in phase noise characteristics of $f_{IN}$ 32. Beyond 1 KHz and up to about 1 MHz, where VCO2 28 is not responsive, VCO1 20 is responsive to changes in the frequency provided by the crystal oscillator $f_{XTAL}$ and changes in VCO2 28. The reference frequency such as the frequency 30 from a crystal oscillator, as mentioned above, has very low phase noise characteristics in the band from 1 KHz to at least about 1 MHz. Thus, VCO1 20 takes the phase noise characteristics of $f_{XTAL}$ in this bandwidth region. The above system works well so long as the bandwidth for changes in $f_{IN}$ 32 is well within the main PLL bandwidth so that the main PLL can track-out the offsets dynamically as they occur from the changes in VCO2 28.

Figure 2:
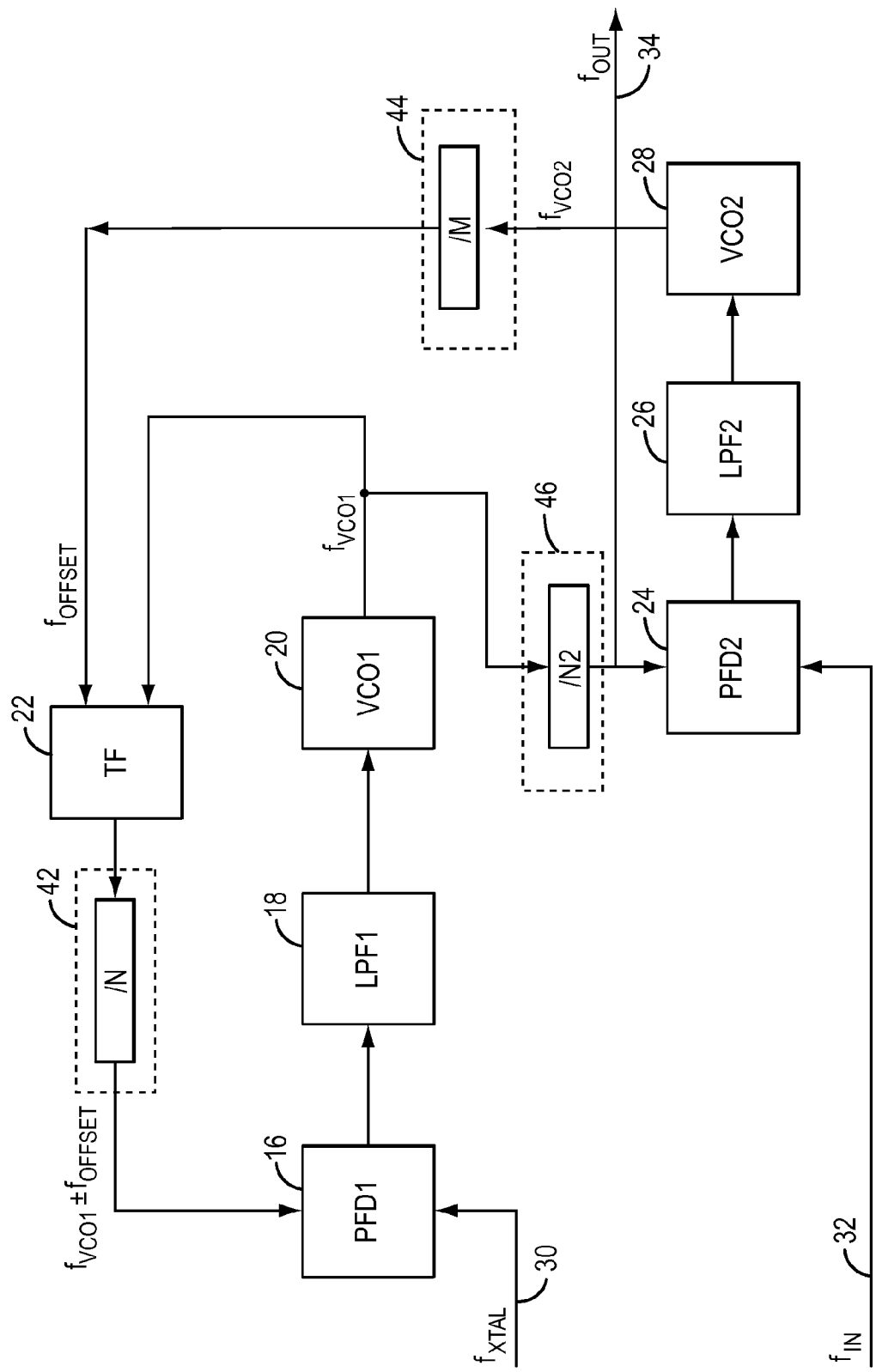
FIG. 2 shows a block diagram of the present invention with dividers.

As mentioned above, the dividers play an important role in the system. FIG. 2 shows the optional use of a divider (/N) 42 in the main PLL 12, a divider (/M) 44 between the secondary PLL 14 and the main PLL 12 and a divider (/N2) 46 on the output of VCO1 20. Because VCO2 28 from the secondary PLL is essentially in series with the crystal oscillator (see FIG. 2), it is important that VCO2 have a low phase noise characteristic. The phase noise of VCO2 28 can be improved by operating VCO2 28 at a higher frequency and dividing it by some number M 44. For example, by dividing VCO2 28 by a large number (say 100) before using VCO2 28 to control VCO1 20, the noise of VCO2 28 is reduced by about 40 dB (20 dB/decade*2 decades). It is important to note that the noise characteristics of VCO2 28 have a relatively small effect on the overall noise characteristics, because VCO2 28 is usually a small fraction of the frequency at the output $f_{OUT}$ 34. Finally, if it is desired to have the output frequency be a divided version of the frequency of VCO1 20, then a divider/N2 46 is used as shown. Thus, the present invention is able to achieve very good performance at close-in phase noise (approaching that of the reference frequency) even though the native close-in performance of the VCO2 28 may appear inadequate from initial evaluation.

Figure 3:
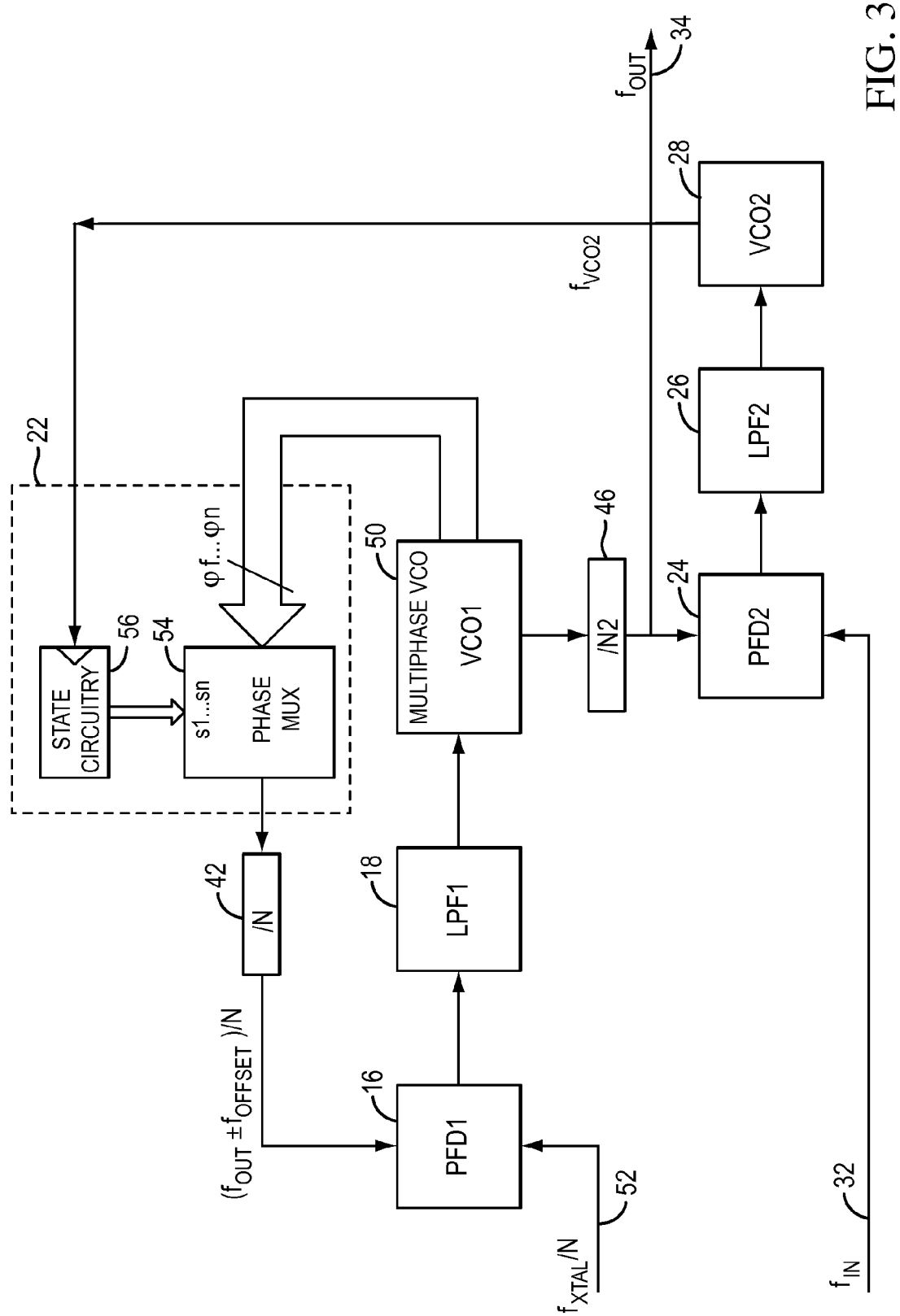
FIG. 3 shows a more detailed block diagram of an embodiment of the present invention.

FIG. 3 shows a more detailed block diagram of an embodiment of the present invention. The system comprises a main PLL 12 and an secondary PLL 14 as shown in FIGS. 1A, 1B and 2. Shown in more detail is the frequency translation circuit 22 which includes a phase multiplexer 54 and state circuitry 56. Key to the use of the phase multiplexer 54 for frequency translation is the use of a multiphase oscillator for VCO1 50. Each of a plurality of phase-shifted signals of the multiphase oscillator 50 connects to an input of the phase multiplexer 54 and the state circuitry 56, being clocked by VCO2 28, provides the selection inputs to the phase multiplexer 54. Operation of the frequency translation circuit 22 is based on the concept that selecting phase-shifted signals of the multiphase oscillator 50 in a particular order and at a constant rate (based on the frequency of VCO2 28) is the same as translating a frequency by VCO2 28. If the sequence of phase shifted outputs of the multiphase oscillator is "upwards" (in the same direction as the natural progression of the phases of the multiphase oscillator), the frequency translation circuit 22 translates the frequency of VCO1 50 down by the frequency of VCO2 28. If the sequence of phase shifted signals is "downwards" (in the opposite direction to the natural progression of the phases of the multiphase oscillator), the frequency translation circuit 22 translates the frequency of VCO1 50 up by the frequency of VCO2 28. The number of phase shifted signals used depends on the divider ratio needed to lower the phase noise of VCO2 28. For example, if it is desired for phase noise reasons to divide VCO2 by 8, then eight phase-shifted signals are used and the phase multiplexer 54 selects one of these eight signals for output. The state circuitry 56 provides the eight states and selection inputs to the phase multiplexer 54. It should be noted that the phase multiplexing process is a discrete process, as each step occurs at a discrete time, and thus the output of the multiplexer 54 is not clean with respect to phase noise. However, the output of the phase multiplexer 54 is not used directly. Before it can have any effect on VCO1 50, it is filtered by LFP1 18. If the offset frequency is high enough, noise from the phase multiplexing can be well outside of the bandwidth of LFP1 18 and have little effect on VCO1 50.

Alternatively, it is possible to smooth out the phase multiplexing process by using an extended spot divider (such as that described in U.S. Provisional Application Ser. No. 60/743,621, titled "FREQUENCY DIVIDER," which is incorporated by reference into the present application). For example, if a ring has 64 stages, and carries an extended spot of 16 stages, each of these 16 stages is used to smooth out the phase multiplexing process. As the extended 16 stage spot moves through the stages of the ring, each stage of advance, maintains a blend of 15 phases while only the last phase drops off and a new phase (at the front of the group) is added.

To further smooth out the phase multiplexing process, resistors are added between the moving spot divider and the transistor used for selecting a phase. With the proper time constant, this slows the turning on and turning off of each transistor and permits a form of analog blending of the phases when a new phase is selected. This is shown in FIG. 5B.

Figure 4:
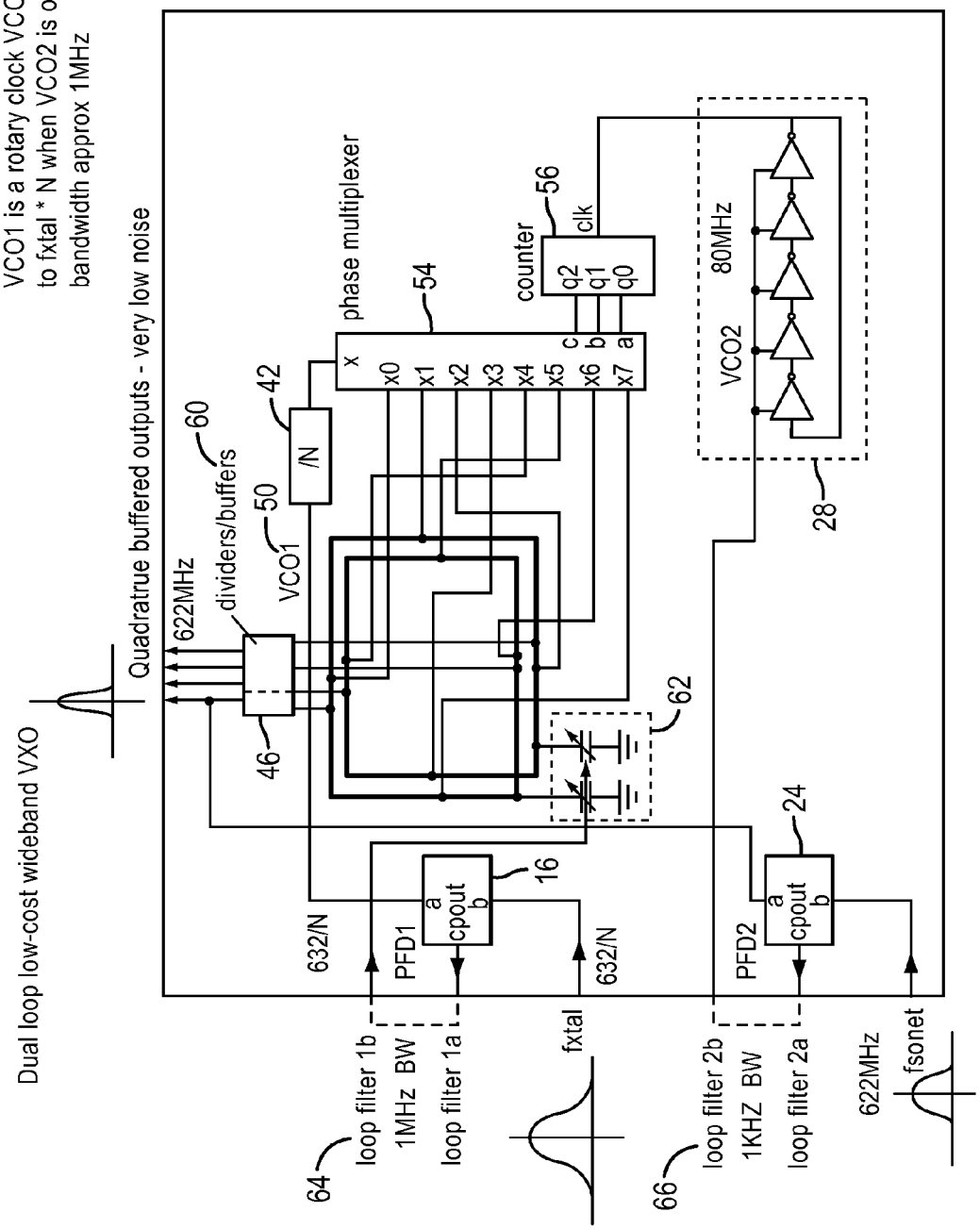
FIG. 4 shows circuitry for an embodiment of the present invention in which a ring oscillator is used for VCO2 and a rotary traveling wave oscillator for VCO1.

FIG. 4 shows circuitry for an embodiment of the present invention in which a ring oscillator is used for VCO2 28 and a rotary traveling wave oscillator for VCO1 50. In this figure, a rotary traveling wave oscillator (described in U.S. Pat. No. 6,556,089, which is incorporated by reference into the present application) is used to implement the multi-phase oscillator, the frequency translation circuit 22 includes a binary counter (for the state circuitry 56) and a phase multiplexer 54, and a ring oscillator is used for VCO2 28. Also in the embodiment, the binary counter 56 divides the frequency of VCO2 28 by eight, thus requiring that the phase multiplexer 54 have eight inputs, each of which is connected to a tap of the rotary traveling wave oscillator 50. The binary counter 56 has its outputs decoded by decoding circuitry in the phase multiplexer 54, but the location of the binary decoder is not important, If the counter 56 counts up (in the direction of the rotary oscillator VCO1 50), then the frequency translation circuit 22 subtracts the offset frequency from the frequency of VCO1 50. If the counter counts down (opposite to the direction of the rotary oscillator VCO1 50), the frequency translation circuit 22 adds the offset frequency to the frequency of VCO1 50. The output frequency $f_{OUT}$ is preferably taken from a buffered version 60 of a tap of the rotary oscillator 50. The low pass filters 64, 66 are implemented as charge pump devices with analog RC components. The low pass filter 64 for the main PLL controls variable capacitors 62, such as digitally-controlled switched capacitors or analog-controlled varactors (or both), to vary the frequency of the rotary oscillator 50. The low pass filter 66 for the secondary PLL controls the supply voltage for the ring oscillator 28 to vary its speed. Finally, a divide by N 42 is used in the main PLL.

To take a numerical example, assume that frequency of $f_{XTAL}$ is 632 MHz and that $f_{IN}$ is 622 MHz (the frequency of the clock for a SONET system STS-12/OC-12). The difference between the $f_{XTAL}$ frequency and the $f_{IN}$ frequency is 10 MHz and this is the frequency offset $f_{OFFSET}$ provided by the secondary PLL. The frequency offset 10 MHz (632 cycles/µs-622 cycles/µs) is equivalent to 1 cycle/0.1 µs. If the one cycle is added in eight phase steps, then each phase step is 12.5 ns and VCO2 28 must operate at 80 MHz, each cycle of VCO2 28 causing a single phase step. (A phase step of 12.5 ns is thus equivalent to 12.5E-9×622E6=7.775 cycles of the 622 MHz oscillator.) Thus, with VCO2 28 operating at 80 MHz and the phase multiplexer providing eight phase steps per cycle, the frequency at the output of the phase selector is increased by 10 MHz. The frequency translation circuit 22 frequency $f_{OUT}+f_{OFFSET}$ is fed back to the phase-frequency detector PFD1 16, which initially detects that VCO1 50 is running too fast (i.e., greater than 632 MHz). It then slows VCO2 28 down so that it runs at 622 MHz (nominally), the frequency output of the frequency translation circuit 22 now being 632 MHz. In the secondary PLL, the output of VCO2 28 $f_{OUT}$ is compared against $f_{IN}$ and because they are the same, there is no change to the frequency of VCO2; both the main PLL and the second PLL are locked.

If a frequency change occurs on $f_{IN}$ compared to $f_{OUT}$, this difference is detected by PFD2 16 (within its small bandwidth), and if it is a low frequency change, this difference becomes a correction signal that is passed through by LFP2 66 to VCO2 to alter the frequency of VCO2 28. The altered frequency of VCO2 28 is detected by PFD1 16 (via the frequency translation circuit), which corrects VCO1 50 to remove the difference between $f_{IN}$ and $f_{OUT}$. Thus, in the bandwidth of a 1 KHz offset from the center frequency of $f_{IN}$, the secondary PLL controls the noise characteristics of $f_{OUT}$. Beyond the 1 KHz bandwidth, VCO1 50 tracks the crystal oscillator, up to about 1 MHz. Beyond 1 MHz, the stability of the rotary traveling wave oscillator is the chief contributor to the stability of the frequency $f_{OUT}$. However, beyond 1 MHz the rotary oscillator itself has low phase noise.

Figure 5A:
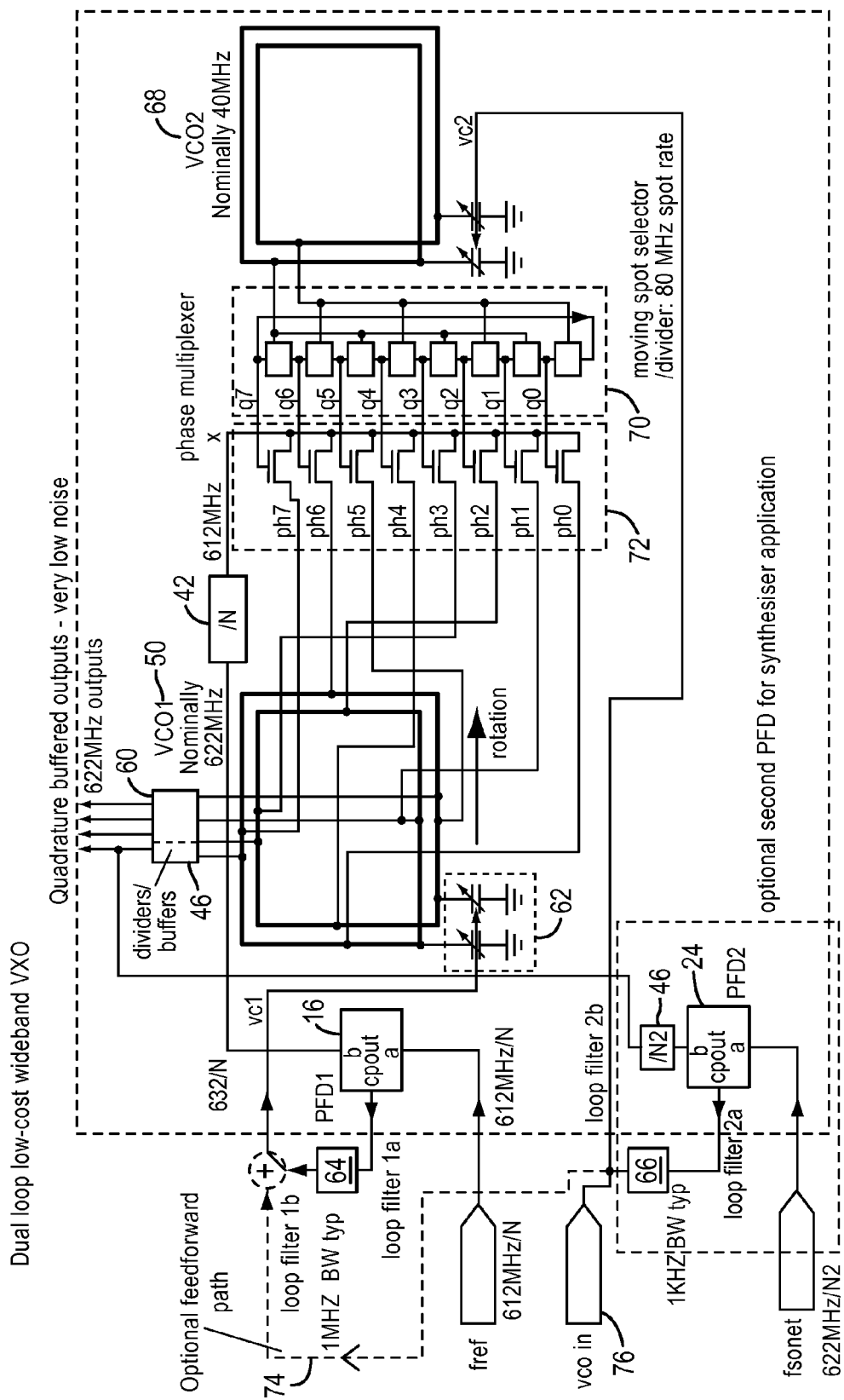
FIG. 5A shows circuitry for an embodiment of the present invention in which rotary oscillators are used for both VCO1 and VCO2.
Figure 5B:
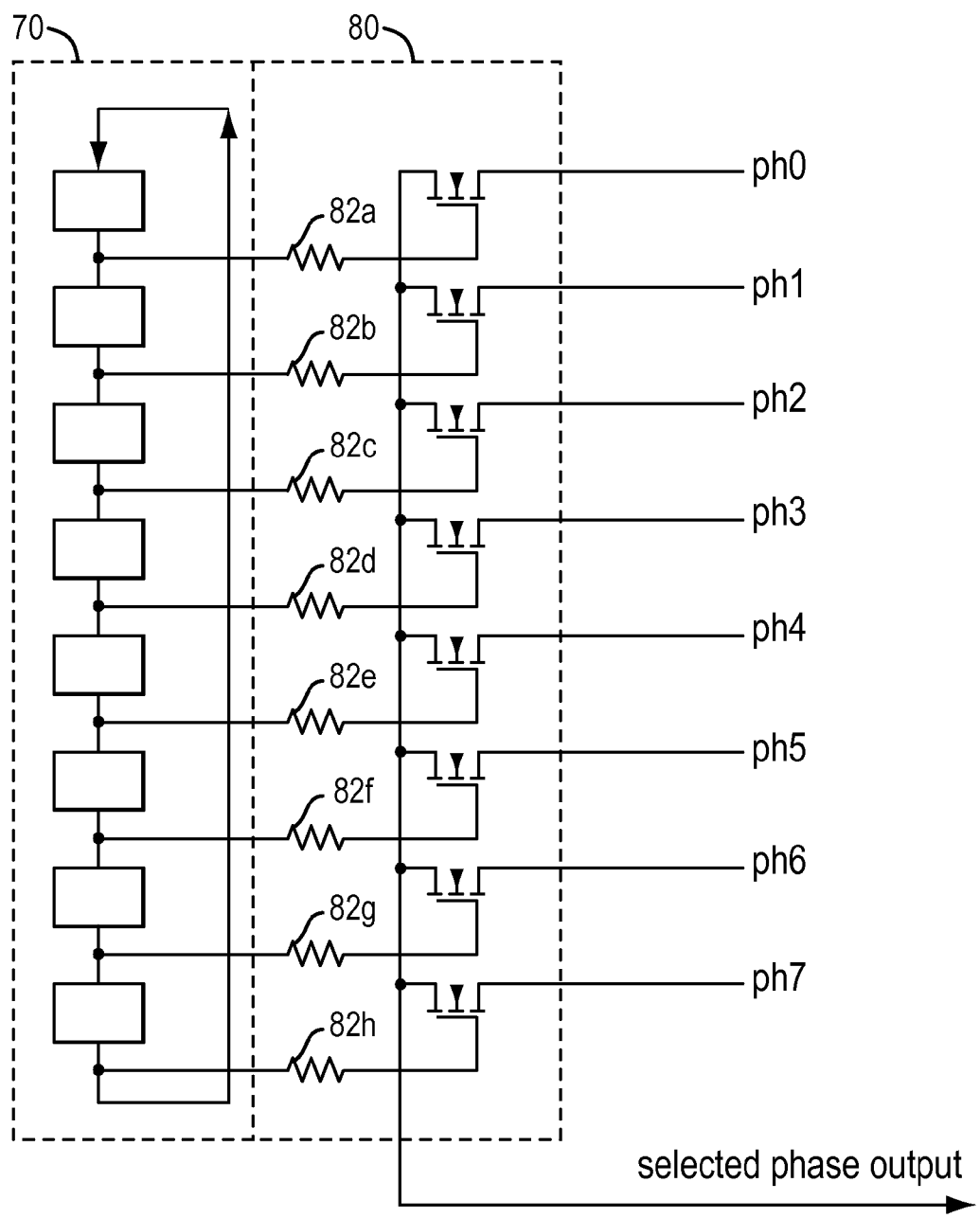
FIG. 5B shows circuitry for an embodiment of the phase multiplexer.

FIG. 5A shows circuitry for an embodiment of the present invention in which rotary oscillators are used for both VCO1 50 and VCO2 68. In this embodiment, the state circuitry includes an eight-stage moving spot divider 70 (as described in U.S. Provisional Patent Application Ser. No. 60/743,621, and incorporated by reference into the present application). If the rotation of the moving spot divider 70 has the same direction as the rotation of the rotary oscillator 50, then the frequency translation circuit 22 computes $f_{OUT}-f_{OFFSET}$ (translates $f_{OUT}$ down by $f_{OFFSET}$). If the rotation of the moving spot divider 70 has the opposite direction as the rotation of the rotary oscillator 50, then the frequency translation circuit 22 computes $f_{OUT}+f_{OFFSET}$ (translates $f_{OUT}$ up by $f_{OFFSET}$). Because the moving spot divider 70 needs no decoding, each stage is used to directly to select, in the phase multiplexer 72, one of the phases of the multiphase oscillator VCO1 50. The eight stage moving spot divider 70, operating from a two phase clock, produces a divide-by-four function, so VCO2 68 operates nominally at 40 MHz. This causes the frequency offset to remain at 10 MHz. In effect, the phase steps occur on every half cycle of the 40 MHz VCO2 68. Also shown in FIG. 5 is a divider (divide by N2) 46 between the output of VCO1 50 and PFD2 24.

As a second, more complex, numerical example, assume that there is a 10 MHz crystal, a divider (/N) 42 in the main PLL loop, 128 phase steps for VCO2, an input frequency of 622.08 MHz (the SONET frequency), and a divide-by-eight divider (/N2) 46 on VCO1. This means that VCO1 operates at 8*622.08 MHz=4976.64 MHz. Therefore, $10N=4976.64 \pm f_{OFFSET}$(units are MHz). If N is chosen to be 492, then $f_{OFFSET}$ is 56.64 MHz and because there are 128 phase steps for VCO2, the latter operates at 128*56.54 MHz=7249.92 MHz (a frequency higher than VCO1). An offset frequency of 56.64 MHz is equivalent to 1 cycle/0.017655 us. Because there are 128 phase steps by VCO2, each phase step is 0.000138 uS. With VCO1 50 operating at 4976.64 MHz, each phase step represents about 0.686 cycles of VCO1 50 and all 128 phase steps represent 87.86 cycles.

The gain constant $K_{VCO1}$ for VCO1 50, is approximately 15 MHz/volt (assuming ±11.25% varactor tuning and 1 volt control and /8) and the gain constant $K_{VCO2}$ for VCO2 68 is about 0.354 MHz/volt (based on the adjustment range for the offset frequency of ±2.5%). For convenience, VCO2 68 rotary oscillator can be constructed inside the physical confines of the VCO1 rotary oscillator 50. Note, in this case, that the frequency translation circuit means 22 subtracts, instead of adds, the $f_{OFFSET}$ from the frequency of VCO1.

Optionally, in the embodiment of FIG. 5, the output of LPF2 66 can be fed forward via path 74 to LFP1 64 to speed the adjustment process. Normally, if frequency error in $f_{IN}$ must wait for the PFD1 16 of the main PLL to sense the frequency difference and adjust. This takes a certain amount of time and slows the loop response. The feed-forward configuration helps to remove the delay in response. Any difference sensed by PFD2 24 is fed forward to PFD1 16 (with the correct polarity), so that the main PLL can adjust more quickly. Once the error is removed, the correction signal fed forward is zero and the main PLL is locked to $f_{XTAL}$. Knowing the $K_{VCO}$ of both VCO1 and VCO2 and the loop filter capacitances of the main PLL, permits a coupling capacitor to be calculated and added between LFP2 and LFP1.

Also shown in FIG. 5A is an application in which the second phase detector PFD2 24 and low pass filter LPF2 66 are not present. In this application, a control input 76 is directly connected to VCO2 68. Changes to VCO2 68 are then reflected in changes to VCO1 50.

FIG. 5B shows circuitry for an embodiment of the phase multiplexer 80. The figure illustrates the addition of resistors 82a-b between the gate of the selection transistors and the moving spot divider 70 in FIG. 5A.

Figure 6:
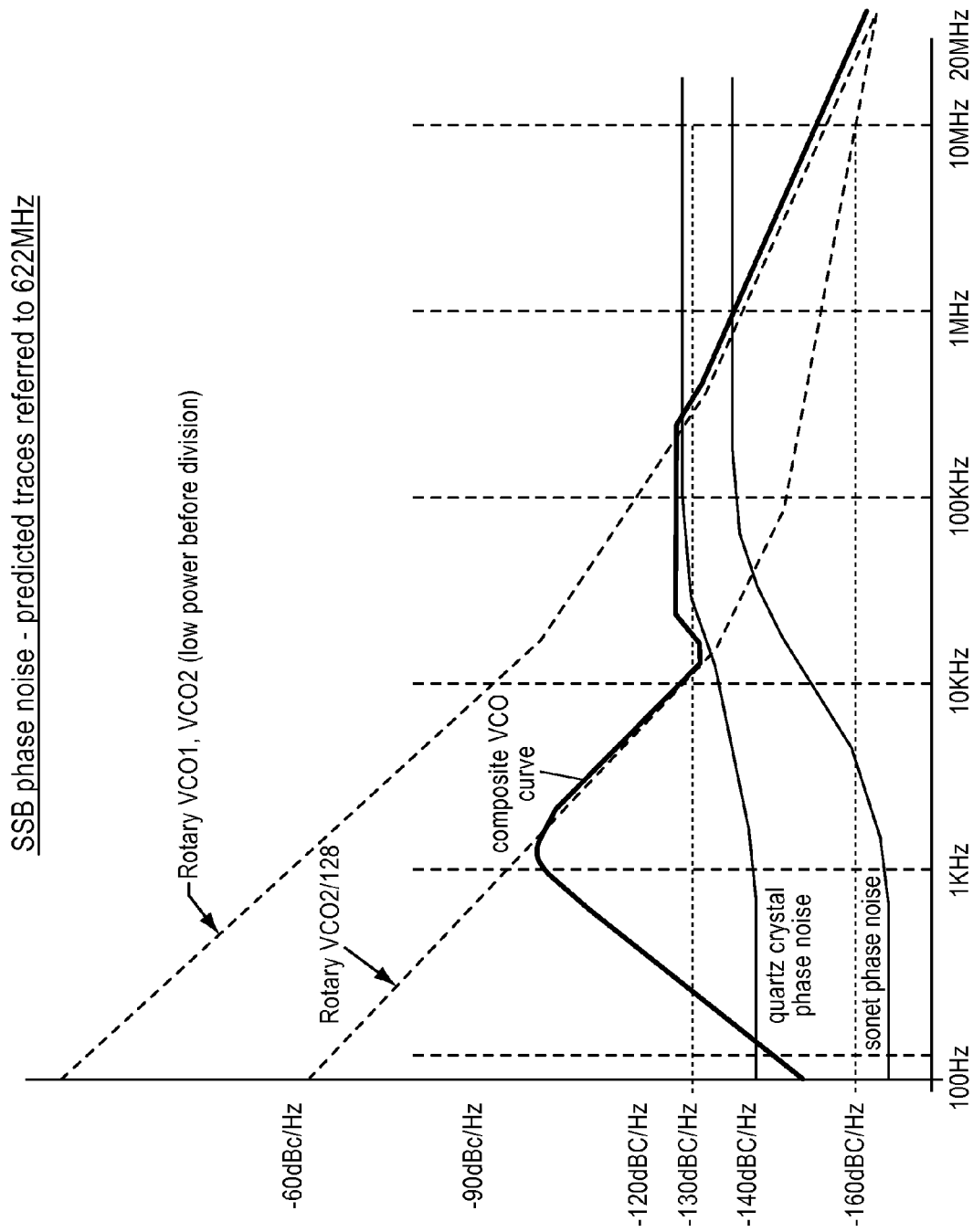
FIG. 6 shows a phase noise plot for the present invention.

FIG. 6 shows a phase noise plot for the present invention. It is expected that the phase noise rise slowly from a value near the close-in phase noise of the input frequency (SONET phase noise) to a value on the curve for the VCO of the secondary PLL at a frequency near the cutoff frequency (about 1 KHz) of the LPF of the secondary PLL. At this frequency up to the highest frequency (about 1 MHz) in the bandwidth of the main PLL, the phase noise is closely related to the phase noise of the crystal oscillator. Beyond the cutoff frequency of the LPF of the main PLL, the phase noise follows that of the VCO of the main PLL.

Implementation Details

To set up the main and secondary PLLs, a digital controller is used. Typically, rotary clock VCOs use a combination of divider circuits, switched capacitor circuits and/or switched and analog varactors to control their phase and frequency. On power up, a digital controller sequences the above controls to set each VCO to the center of its operating frequency range before the loops are closed.

Loop Filter and Voltage Controlled Oscillator

There is a need in many applications to have a PLL with loop-bandwidths of Hz or KHz but these are difficult to implement with on-chip loop filter components (for example within an IP block) due to the large values of capacitors needed to make the long time constants implied by these bandwidths. Resistors with large values or charge pumps with very low currents are also impractical for on-chip implementations because of either leakage current or thermal noise issues.

One solution to the problem of large time constants is the use of a digital phase detector and filter combination which can have practically unlimited time constants. But this solution suffers from the problem of high complexity, high chip area usage (on older process technology nodes) and inherent difficulty in making low-noise filters. Thus, it is preferable to have a solution for the large time constant problem that has the benefits of long time constants of digital filter but the low noise benefits of an analog design.

Figure 7:
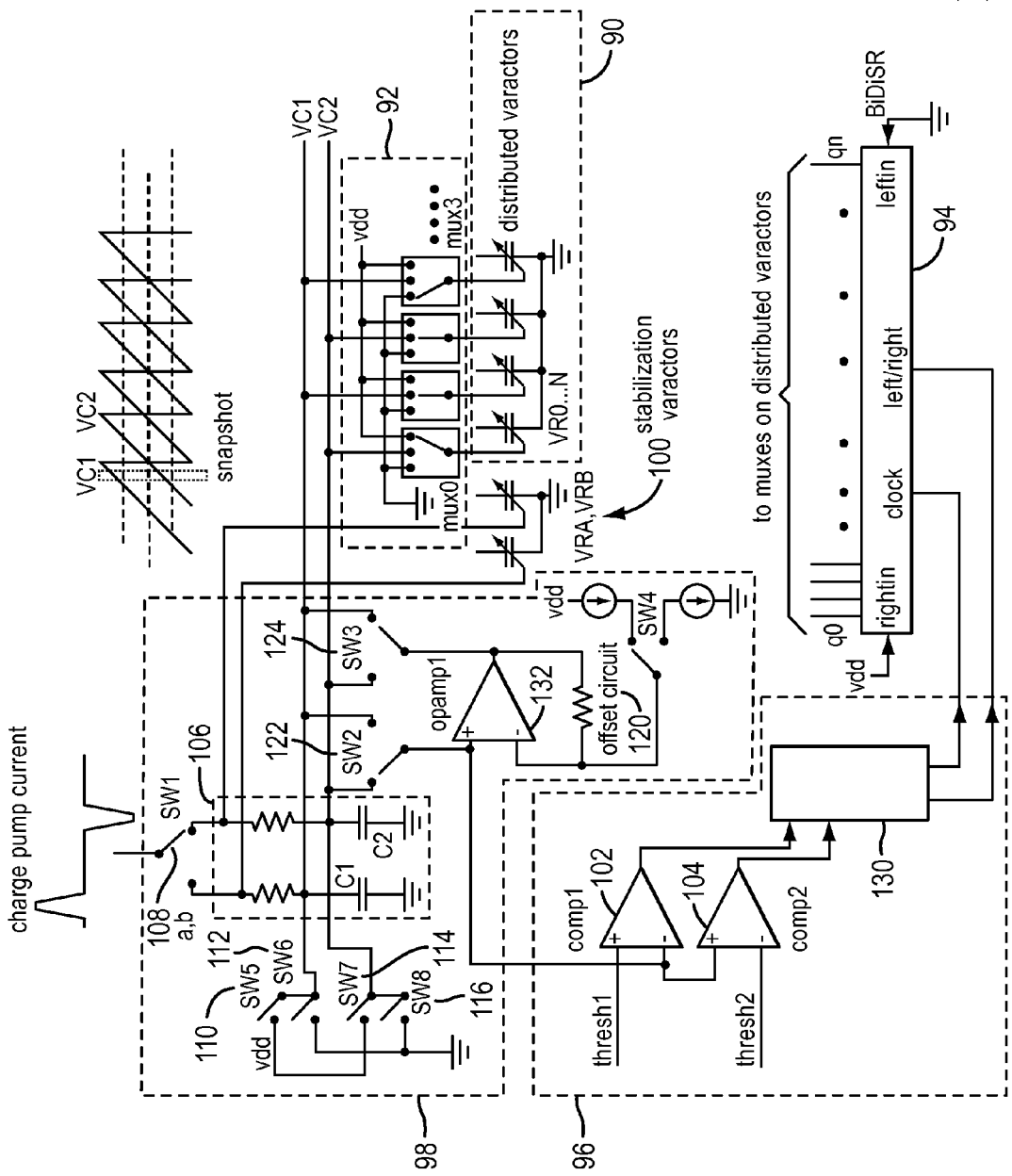
FIG. 7 shows circuitry for implementing voltage control of a rotary oscillator.

FIG. 7 shows circuitry for implementing the charge pump/loop filter and voltage control of a rotary oscillator used in a PLL, such as the main and secondary PLLs described above. As described in U.S. Pat. No. 6,556,089 (which is incorporated by reference), the speed of the traveling wave on the transmission line of the rotary oscillator determines the frequency at which the oscillator operates ($f_{VCO}=v/2l$, where l is the distance of one rotation, and v is the velocity of the wave). The velocity of the wave is influenced by the transmission line characteristics of the line on which the wave travels (v=1/√LC, where L is the inductance and C is the capacitance per unit length on the transmission line). Because the transmission line characteristics include the capacitance on the transmission line, varying the capacitance becomes a convenient way to control the frequency of the oscillator.

Thus, a large number of varactors are connected to the transmission line at approximately constant intervals over the length of the line. Tuning the oscillator amounts to controlling the varactors, a few of which are shown in FIG. 7. The varactors have the characteristic that the capacitance provided is sensitive to the voltage on the control node within a certain voltage range. Outside of this voltage range, the capacitance of the varactor is not (or very much less) sensitive to changes in its control voltage. Therefore, it is desirable to maintain at least one varactor in the sensitive range so that the capacitance of the oscillator is kept under control. The circuit in FIG. 7 accomplishes this.

The circuit of FIG. 7 includes a large number, preferably, of varactors 90 distributed over the transmission line, a plurality of three-to-one multiplexers 92, one connected to each varactor, a bidirectional shift register 94 for controlling the multiplexers 92, a control circuit 96 for clocking the shift register 94 either left or right, a charge pump filter circuit 98, and a number of varactors 100 for loop stability. The control circuit 96 includes comparators 102 104 for sensing whether a control voltage to a varactor has exceeded the control range, such that a shift of the shift register 94 is needed. The charge pump filter circuit 98 includes a pair of RC circuits 106 that provide a pair of control voltages (VC1 or VC2), a switch SW1 108 that steers the charge pump current to one or other of the RC circuits 106, a set of switches (SW5 110, SW6 112, SW7 114, SW8 116) that grounds or sets the pair of control voltages to the supply voltage, an offset circuit 120 and a pair of switches (SW2 122 and SW3 124) that provide an offset voltage one either one of the control voltages.

Each of the varactors 90 (except the stability varactors 100) has a voltage control input that is connected to a three-to-one multiplexer 92. The voltage to each varactor 90 is either connected to ground, an analog control voltage VC1 or VC2, or to the supply voltage Vdd, depending on the state of the selection inputs of the multiplexer 92.

Operation of the charge pump filter circuit is as follows. Switch SW1 108 steers the charge pump current to either the R1/C1 circuit 108a or the R2/C2 circuit 108b. Switches SW5-8 110, 112, 114, 116 are open. Assuming that the R1/C1 circuit 108a is selected first, the voltage on C1 begins to ramp upwards. While the voltage is changing on C1, the offset circuit 120 causes the voltage to change on C2, but with an offset, because SW2 122 connects the opamp1 non-inverting input to VC1 and the opamp1 output to VC2. For example, when VC1 is at 0.75 Vdd, then VC2 is at 0.25 Vdd. When the voltage reaches a maximum on VC1, and charging is still occurring, SW1 108 steers the charge pump current to the R2/C2 circuit, which now has a voltage (on VC2) in the sensitive range. At this time, the voltage on VC1 is discharged by SW6 to ground safely because it is not controlling any of the varactors. The voltage on VC2 continues to increase due to charge pump action (after the discharge of VC1), the voltage on VC1 now follows behind by an offset due to the offset circuit 120. This continues while the charge pump current is being supplied and results in the overlapping voltages on VC1 and VC2 shown in the figure.

Operation of the control circuit and the shift register is as follows. A pair of comparators sense the voltage on either VC1 or VC2 and compare via 102 and 104 against two thresholds, thresh1 and thresh2. The results of these comparisons are decoded by a state machine 130 which decides to either shift the shift register 94 right or left. Shifting to the right occurs when the voltage on VC1 and VC2 are both increasing. Shifting to the left occurs when the voltage on VC1 and VC2 are both decreasing.

Operation of the varactor circuitry is based on a group of two actively controlled varactors, as shown in the figure. Assume that the VCO is operating at its highest frequency, which is a state of minimum capacitance on the transmission lines, the shift register 94 has all zeros, and each multiplexer in 92 connects the corresponding varactor in 90 voltage to ground. It is desired to slow the frequency of the VCO down to its minimum frequency. First, two "ones" are shifted into the shift register 94. This causes the first multiplexer to connect the VR0 control voltage to VC1 and the second multiplexer to connect the VR1 control voltage to VC2. The other multiplexers still connect their varactor's control inputs to ground. The voltage on VC1 begins to rise thereby increasing the capacitance provided by varactor VR0 (and lowering the frequency of the oscillator). The voltage on VC2 begins to rise as well but with an offset, as described in the operation of the charge pump filter circuit.

When the voltage on VC1 reaches its limit, switch SW2 switches to charge VC2 and the control circuit shifts the shift register 94 one step to the right. This causes the voltage on the control input to VR0 to be held at Vdd by its multiplexer, the voltage on VR1 to be controlled by VC2, and the voltage on VR2 to be controlled by VC1, which, after being discharged to ground, follows the voltage on VC2. Several things should be noted here. First, switching the VR0 control voltage to Vdd causes no disturbance to VR0 because its control voltage had reached that level by the charging of VC1. Second, switching VR3 to be controlled by VC1 causes no disturbance to VR3 because its control voltage was at ground and VC1 starts at ground. Third, there is no disturbance caused by discharging the VC1 control voltage to ground because the discharging occurs at a time when VC1 is not controlling any of the varactors (i.e., before the charging of VC2).

When the voltage on VC2 reaches its limit, SW1 108 switches to charge VC1 and the control circuit shifts the shift register another step to the right. The new state of the shift register causes the control voltage on VR0 and VR1 to be held at Vdd by the multiplexer, the voltage on VR2 to be controlled by VC1, and the voltage on VR3 to be controlled by VC2.

Thus, a zero in the shift register 94 causes the corresponding multiplexer in 92 to connect a varactor control input to ground and a "1" behind the two right most "1s" in the shift register causes the corresponding multiplexer in 92 to connect a varactor control input to Vdd. The right most two "1s" in the shift register cause each corresponding multiplexer to connect the varactor control input to either VC1 or VC2, even numbered varactors being connected to VC1 and odd numbered varactors being connected to VC2. In effect, the shift register contains a "varactor control string" comprising a string of "1s" and "0s" and a number of analog voltages in-between (in the example described two analog voltages between the string of "1s" and "0s"). This string is extended or retracted, thermometer-style, left or right, to control the frequency and phase of the VCO from the charge pump input. Operation in reverse, i.e., to decrease the frequency from a minimum value to a maximum value, means shifting the shift register to the left after it has filled with all ones and discharging voltages VC1 and VC2 from their starting values.

Thus, tuning of the VCO is progressive, analog then digital with a smooth handover. After each varactor is tuned to its limit (up or down), it is switched to stay at the limit and another varactor is engaged to operate in the analog mode. The two small loop-filter capacitor voltages VC1 and VC2 are constantly emptied and re-filled by the charge pump, thereby causing a capacitance multiplication to occur. The total charge needed to tune the VCO from one limit to the other is many times the full charge on the R1/C1 108a or R2/C2 108b circuits, making the effective time constant appear much larger. With this mixed digital/analog method, small filter capacitors can be used but with equal noise performance of a larger capacitor. This capacitance multiplication effect incurs little digital noise, if arranged as described here.

Loop Stability

The circuitry described so far provides a pure integration response, which is known to be generally unstable in a PLL closed-loop using a PFD. With the addition of components Rcomp1, Rcomp2 and two directly-controlled varactors VRA and VRB, the loop can be stabilized in the usual way, with a signal path with immediate effect on the phase of the oscillator.

For faster settling, one possibility is switching more than one or two varactors at each step of the shift register to allow for control of the PLL loop bandwidth for faster setting time.

Figure 8:
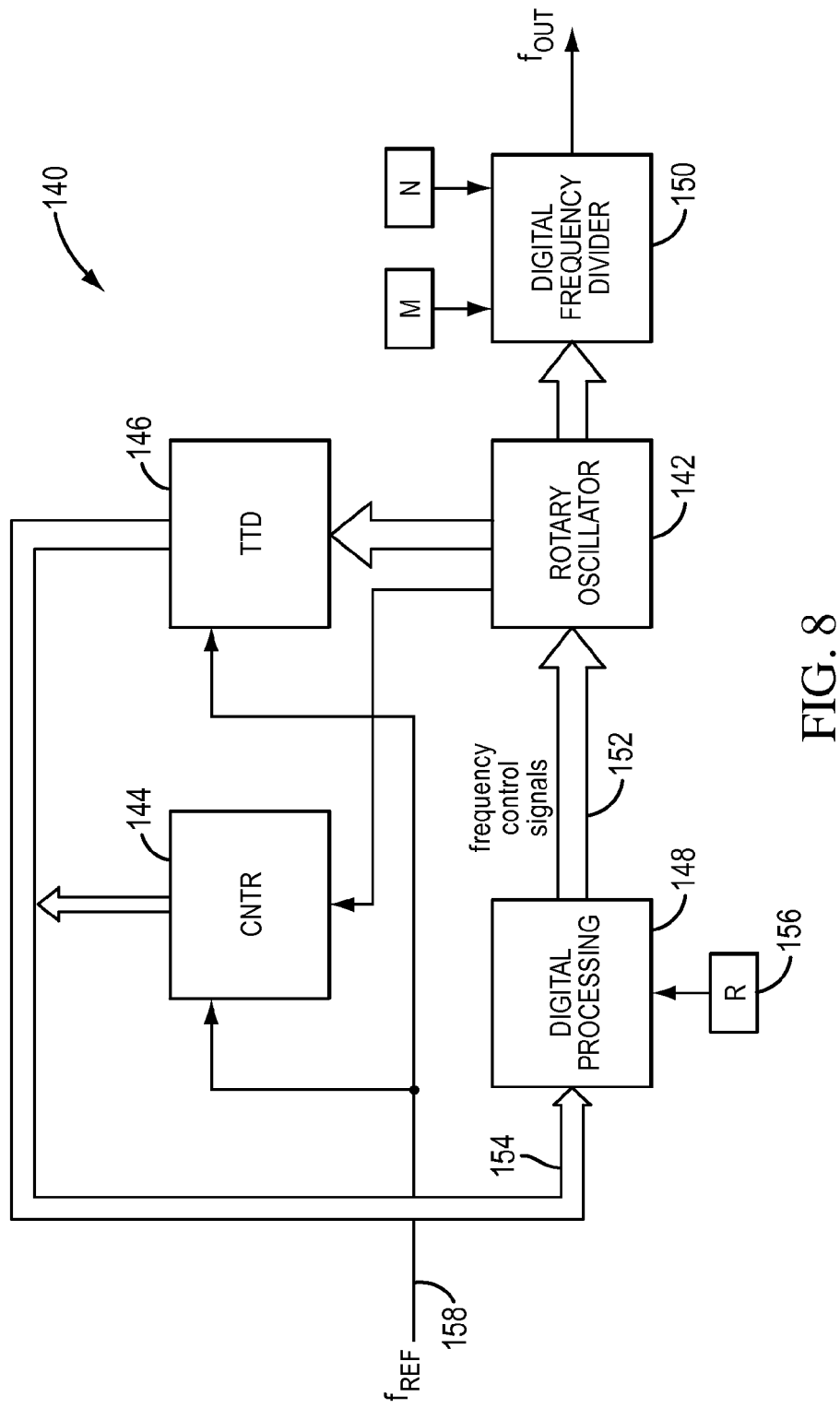
FIG. 8 shows a time-locked loop that includes a rotary oscillator, a counter and time to digital converter, and a digital processing unit.

Referring to FIG. 8, in another embodiment, a time-locked loop 140 includes a rotary oscillator 142, a counter 144 and time to digital converter 146, and a digital processing unit 148. The output of the rotary oscillator 142 can be divided by a digital divider 150 such as the one described in U.S. patent application Ser. No. 11/121,161, titled "DIGITAL FREQUENCY SYNTHESIZER", filed on May 2, 2005, which is incorporated by reference. The time-to-digital converter 146 is described in U.S. Provisional Patent Application Ser. No. 60/754,224, titled "ROTARY CLOCK FLASH ANALOG TO DIGITAL CONVERTER SYSTEM AND METHOD", filed on Dec. 27, 2005, which is incorporated by reference, which is now U.S. patent application Ser. No. 11/616,263, filed Dec. 26, 2006, which is also incorporated by reference.

The rotary oscillator 142 provides a plurality of phase signals to the time-to-digital converter 146 and at least one phase signal to the counter 144. The rotary oscillator receives a plurality of control inputs 152 from the digital processing unit 148. These inputs adjust the phase and frequency of the oscillator 142. The digital processing unit 148 receives the digital signals 154 from the time-to-digital converter 146 and the counter 144 and an input integer R 156 to determine output signals that control the frequency and phase of the rotary oscillator 142.

In operation, at every occurrence of a transition of the reference clock signal 158, a sample of the counter 144 and the time-to-digital 146 converter is taken. These samples can be used to determine the actual time between transitions of the reference in terms of integer cycles and fractional cycles (phase) of the rotary clock 142. Assuming that the reference frequency is stable, a discrete time sequence of sample errors is computed by the digital processing unit 148, where the sample error is the difference between a desired sample digital number (this could be an integer input or a very long time-averaged set of samples) and the measured sample digital number. These sample errors are then averaged by an appropriate filter function over a sufficient period of time and applied to correct the frequency and phase of the rotary oscillator.

MULTIPHASE OSCILLATOR

Known transmission-lines broadly fall into two categories in that they are either open-ended or specifically terminated either partially or fully. Transmission-lines as proposed herein are different in being neither terminated nor open-ended. They are not even unterminated as such term might be understood hitherto; and, as unterminated herein, are seen as constituting a structural aspect of invention, including by reason of affording a signal path exhibiting endless electromagnetic continuity.

Figure 9:
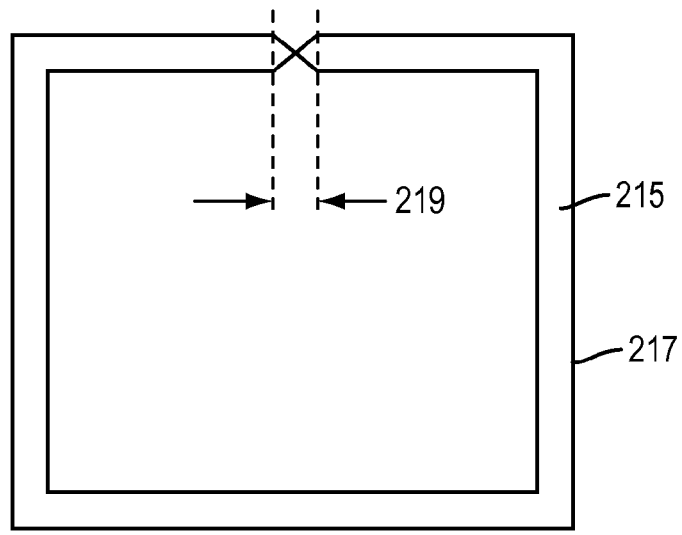
FIG. 9 is an outline diagram for a transmission-line structure hereof.

FIG. 9 shows such a transmission-line 215 as a structure that is further seen as physically endless, specifically comprising a single continuous "originating" conductor formation 217 shown forming two appropriately spaced generally parallel traces as loops 215a, 215b with a cross-over at 219 that does not involve any local electrical connection of the conductor 217. Herein, the length of the originating conductor 217 is taken as S, and corresponds to two 'laps' of the transmission-line 215 as defined between the spaced loop traces 15a, 15b and through the cross-over 219.

Figure 10:
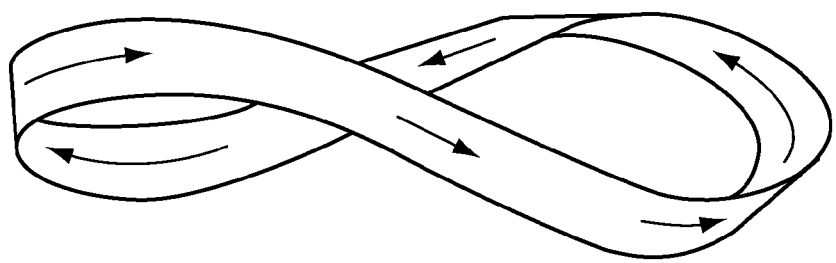
FIG. 10 shows a Moebius strip.

This structure of the transmission-line 215 has a planar equivalence to a Moebius strip, see FIG. 10, where an endless strip with a single twist through 180° has the remarkable topology of effectively converting a two-sided and two-edge, but twisted and ends-joined, originating strip to have only one side and one edge, see arrows endlessly tracking the centre line of the strip. From any position along the strip, return will be with originally left- and right-handed edges reversed, inverted or transposed. The same would be true for any odd number of such twists along the length of the strip. Such a strip of conductive material would perform as required for signal paths of embodiments of this invention, and constitutes another structural aspect of invention. A flexible substrate would allow implementing a true Mobius strip transmission-line structure, i.e., with graduality of twist that could be advantageous compared with planar equivalent cross-over 219. A flexible printed circuit board so formed and with its ICs mounted is seen as a feasible proposition.

Figure 11:
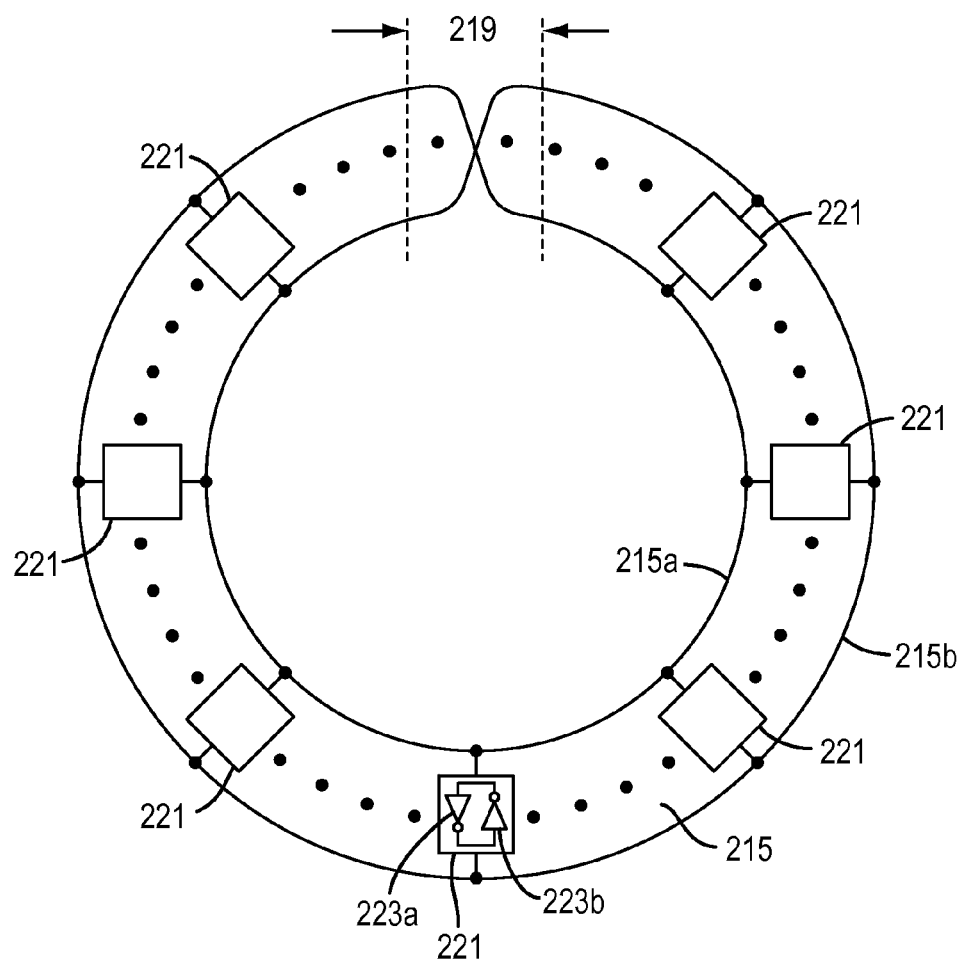
FIG. 11 is an outline circuit diagram for a traveling wave oscillator hereof.

FIG. 11 is a circuit diagram for a pulse generator, actually an oscillator, using the transmission-line 215 of FIG. 9, specifically further having plural spaced regenerative active means conveniently as bi-directional inverting switching/amplifying circuitry 221 connected between the conductive loop traces 215a, 215b. The circuitry 221 is further illustrated in this particular embodiment as comprising two inverters 223a, 223b that are connected back-to-back. Alternatives regenerative means that rely on negative resistance, negative capacitance or are otherwise suitably non-linear, and regenerative (such as Gunn diodes) or are of transmission-line nature. It is preferred that the circuitry 221 is plural and distributed along the transmission-line 215, further preferably evenly, or substantially evenly; also in large numbers say up to 100 or more, further preferably as many as each as small as reasonably practical.

Inverters 223a, 223b of each switching amplifier 221 will have the usual operative connections to relatively positive and negative supply rails, usually V+ and GND, respectively. Respective input/output terminals of each circuit 221 are shown connected to the transmission-line 215 between the loops 215a, 215b at substantially maximum spacing apart along the effectively single conductor 217, thus each at substantially halfway around the transmission-line 215 relative to the other.

Figure 12:
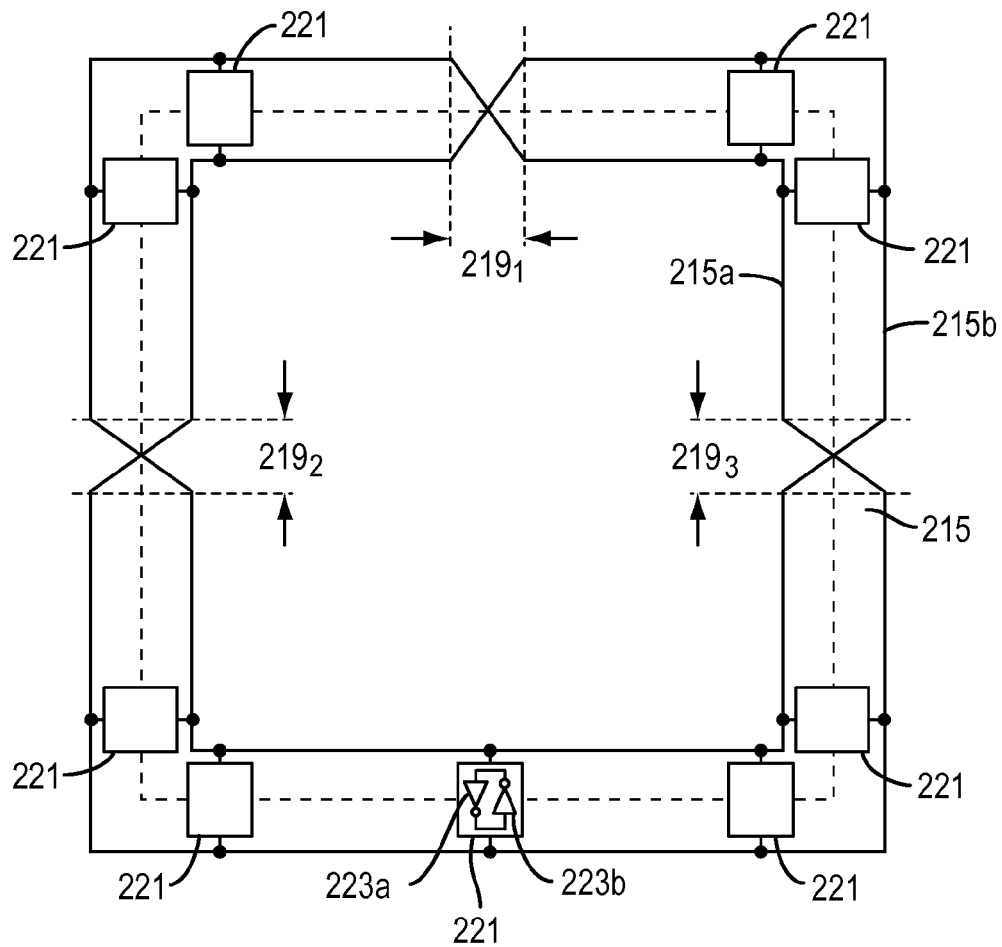
FIG. 12 is another outline circuit diagram for a traveling wave oscillator hereof.

FIG. 12 is another circuit diagram for an oscillator using a transmission-line structure hereof, but with three cross-avers 219a, 219b and 219c, thus the same Moebius strip-like reversing/inverting/transposing property as applies FIG. 11.

The rectangular and circular shapes shown for the transmission-line 215 are for convenience of illustration. They can be any shape, including geometrically irregular, so long as they have a length appropriate to the desired operating frequency, i.e., so that a signal leaving an amplifier 221 arrives back inverted after a full 'lap' of the transmission-line 215, i.e., effectively the spacing between the loops 215a,b plus the crossover 219, traversed in a time Tp effectively defining a pulse width or half-cycle oscillation time of the operating frequency.

Advantages of evenly distributing the amplifiers 221 along the transmission-line 215 are twofold. Firstly, spreading stray capacitance effectively lumped at associate amplifiers 221 for better and easier absorbing into the transmission-line characteristic impedance Zo thus reducing and signal reflection effects and improving poor waveshape definition. Secondly, the signal amplitude determined by the supply voltages V+ and GND will be more substantially constant over the entire transmission-line 215 better to compensate for losses associated with the transmission-lines dielectric and conductor materials. A continuous closed-loop transmission-line 215 with regenerative switching means 221 substantially evenly distributed and connected can closely resemble a substantially uniform structure that appears the same at any point.

A good rule is for elementary capacitance and inductance (Ce and Le) associated with each regenerative switching means and forming a resonant shunt tank LC circuit to have a resonant frequency of $1/(2\pi\sqrt{L_e C_e})$ that is greater than the self-sustaining oscillating frequency F (F3, F5 etc.) of the transmission-line 215.

Figure 13A:
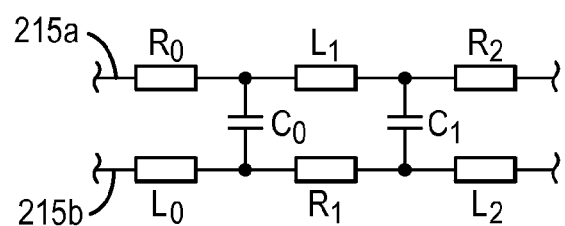
FIGS. 13a and 13a are equivalent circuits for distributed electrical models of a portion of a transmission-line hereof.

FIG. 13a is a distributed electrical equivalent circuit or model of a portion of a transmission-line 215 hereof. It shows alternate distributed resistive (R) and inductive (L) elements connected in series, i.e. $R_n$ connected in series with $L_1$ in turn connected in series with $R_2$ and so on for a portion of loop 215a, and registering $L_0$ connected in series with $R_1$ in turn connected in series with $L_2$ and so on for the adjacent portion of loop 215b; and distributed capacitive elements $C_0$ $C_1$ shown connected in parallel across the transmission-line 15 thus to the loops 215a and 215b between the resistive/inductive elements $R_0/L_1$ and the inductive/resistive elements $L_0/R_1$, respectively for $C_0$ and between the inductive/resistive elements $L_1/R$, and the resistive/inductive elements $R_1/L_2$, respectively for $C_1$: where the identities $R_0=R_1=R_2$, $L_0=L_1=L_2$, and $C_0=C_1$ substantially hold and illustrated distributed RLC model extends over the whole length of the transmission-line 215. Although not shown, there will actually be a parasitic resistive element in parallel with each capacitive element C, specifically its dielectric material.

Figure 13B:
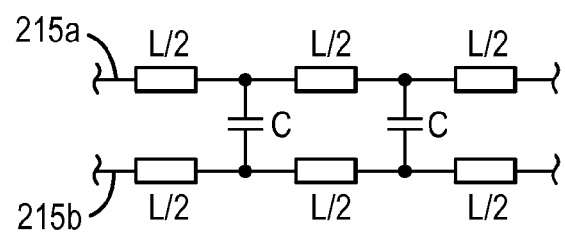

FIG. 13b is a further simplified alternative distributed electrical equivalent circuit or model that ignores resistance, see replacement of those of FIG. 13a by further distribution of inductive elements in series at half (L/2) there value (L) in FIG. 13a. This model is useful for understanding basic principles of operation of transmission-lines embodying the invention.

During a 'start-up' phase, i.e. after power is first applied to the amplifiers 221, oscillation will get initiated from amplification of inherent noise within the amplifiers 221, thus begin substantially chaotically though it will quickly settle to oscillation at a fundamental frequency F, typically within nanoseconds. For each amplifier 221, respective signals from its inverters 223a and 223b arrive back inverted after experiencing a propagation delay Tp around the transmission-line 215. This propagation delay Tp is a function of the inductive and capacitive parameters of the transmission-line 215; which, as expressed in henrys per meter (L) and in farads per meter (C) to include all capacitive loading of the transmission-line, lead to a characteristic impedance $Z_0$=SQR (L/C) and a line traverse or propagation or phase velocity–Pv=1/SQRT(L/C). Reinforcement, i.e., selective amplification, of those frequencies for which the delay Tp is an integer sub-divisor of a half-cycle time gives rise to the dominant lowest frequency, i.e. the fundamental frequency F=1/(2·Tp), for which the sub-divisor condition is satisfied. All other integer multiples of this frequency also satisfy this sub-divisor condition, but gain of the amplifiers 221 'falls off', i.e., decreases, for higher frequencies, so the transmission-line 215 will quickly settle to fundamental oscillation at the frequency F.

The transmission-line 215 has endless electromagnetic continuity, which, along with fast switching times of preferred transistors in the inverters 223a and 223b, leads to a strongly square wave-form containing odd harmonics of the fundamental frequency F in effectively reinforced oscillation. At the fundamental oscillating frequency F, including the odd harmonic frequencies, the terminals of the amplifiers 221 appear substantially unloaded, due to the transmission-line 215 being 'closed-loop' without any form of termination, which results very desirably in low power dissipation and low drive requirement. The inductance and capacitance per unit length of the transmission-line 215 can be altered independently, as can also be desirable and advantageous.

Figure 14:
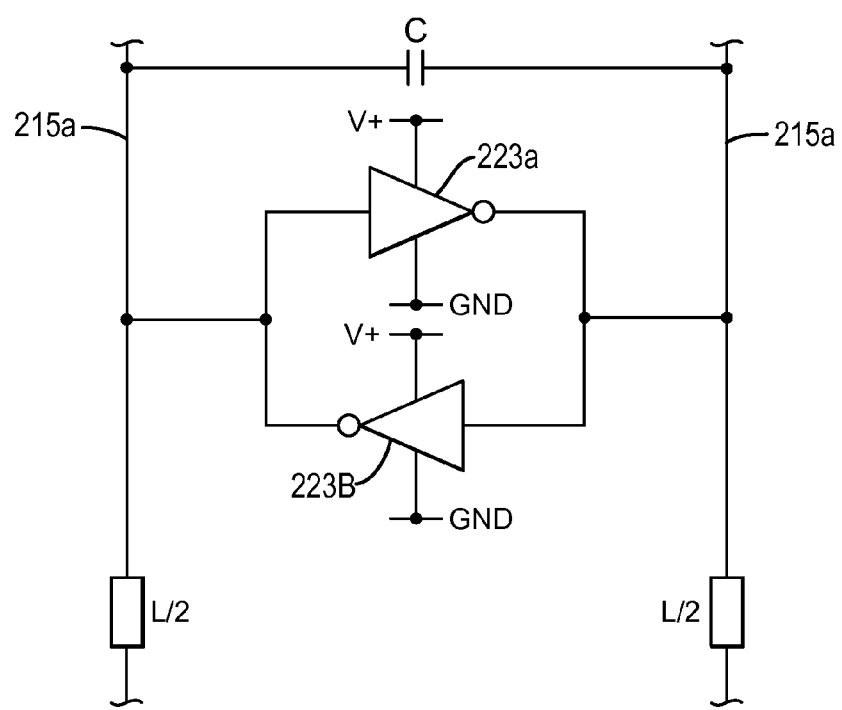
FIG. 14 shows a pair for back-to-back inverters connected across part of a transmission-line.
Figure 15A:
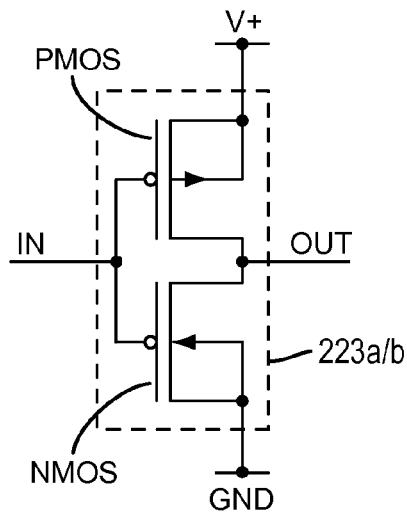
FIGS. 15b and 15b are outline and equivalent circuit diagrams of CMOS back-to-back inverters.
Figure 15B:
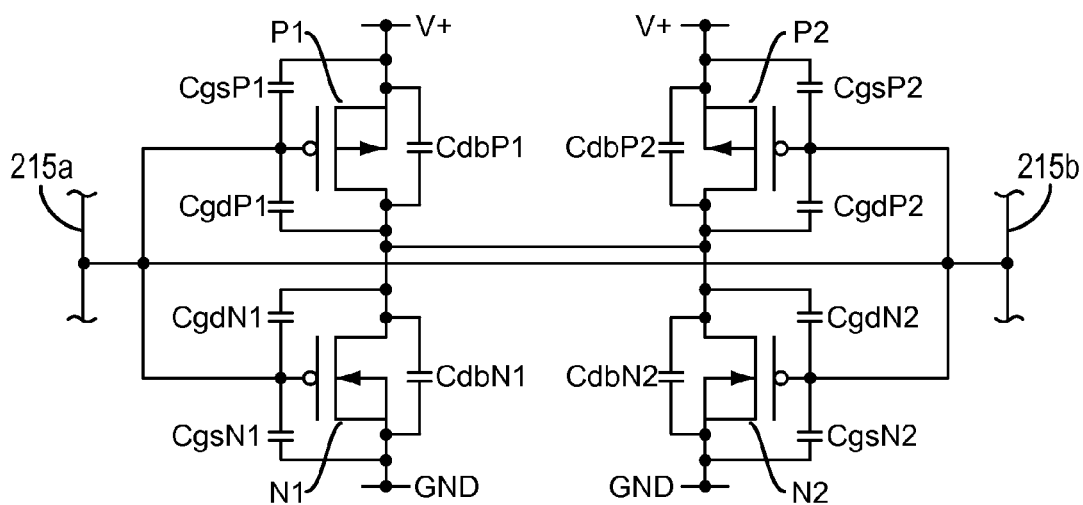

FIG. 14 shows a pair of back-to-back inverters 223a, 223b with supply line connectors and indications of distributed inductive (L/2) and capacitive (C) elements of a transmission-line as per FIG. 15b. FIG. 15a shows N-channel and P-channel Mosfet implementation of the back-to-back inverters 223a and 223b, see out of NMOS and PMOS transistors.

FIG. 15b shows an equivalent circuit diagram for NMOS (N1, N2) and PMOS (P1, P2) transistors, together with there parasitic capacitances. The gate terminals of transistors P1 and N1 are connected to the conductive trace 215a and to the drain terminals of transistors P2 and N2. Similarly, the gate terminals of transistors P2 and N2 are connected to the conductive trace 215b and to the drain terminals of transistors P2 and N2. The PMOS gate-source capacitances CGSP 1 and CgsP2, the PMOS gate-drain capacitances CgdP 1 and CgdP2, and the PMOS drain-source and substrate capacitances CdgP 1 and CdbP2, also the NMOS gate-source capacitances CgsN1 and CgsN2, the NMOS gate-drain capacitances CdgN1 and CdgN2, and the NMOS drain-source and substrate capacitances CdbN1 and CbdN2 are effectively absorbed into the characteristic impedance $Z_0$ of the transmission-line, so have much less effect upon transit times of the individual NMOS and PMOS transistors. The rise and fall times of the waveforms Φ1 and Φ2 are thus much faster than for prior circuits.

SPOT DIVIDER

Figure 16A:
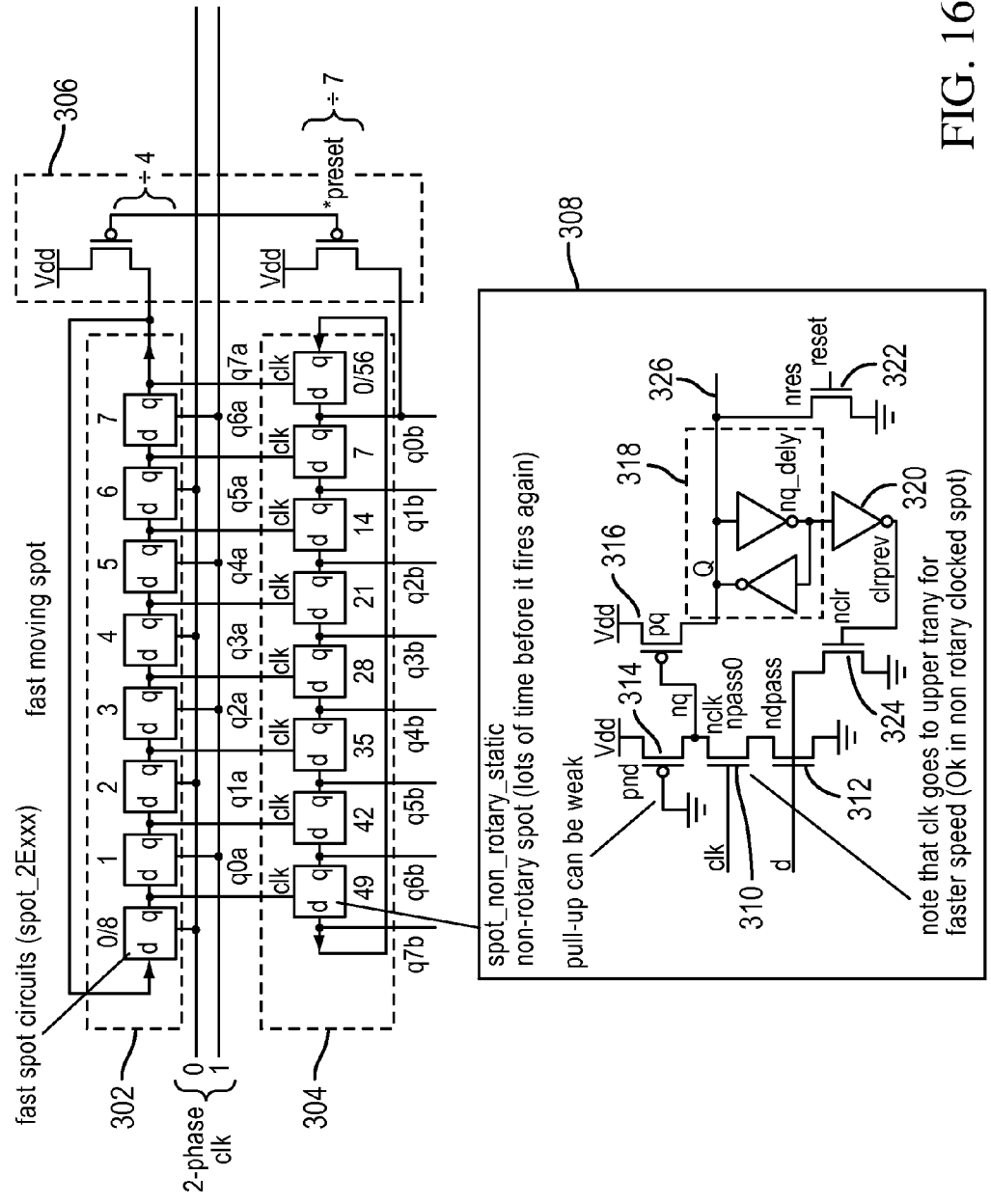
FIG. 16A shows a divide-by-28 function with an example of a static spot stage.
Figure 16B:
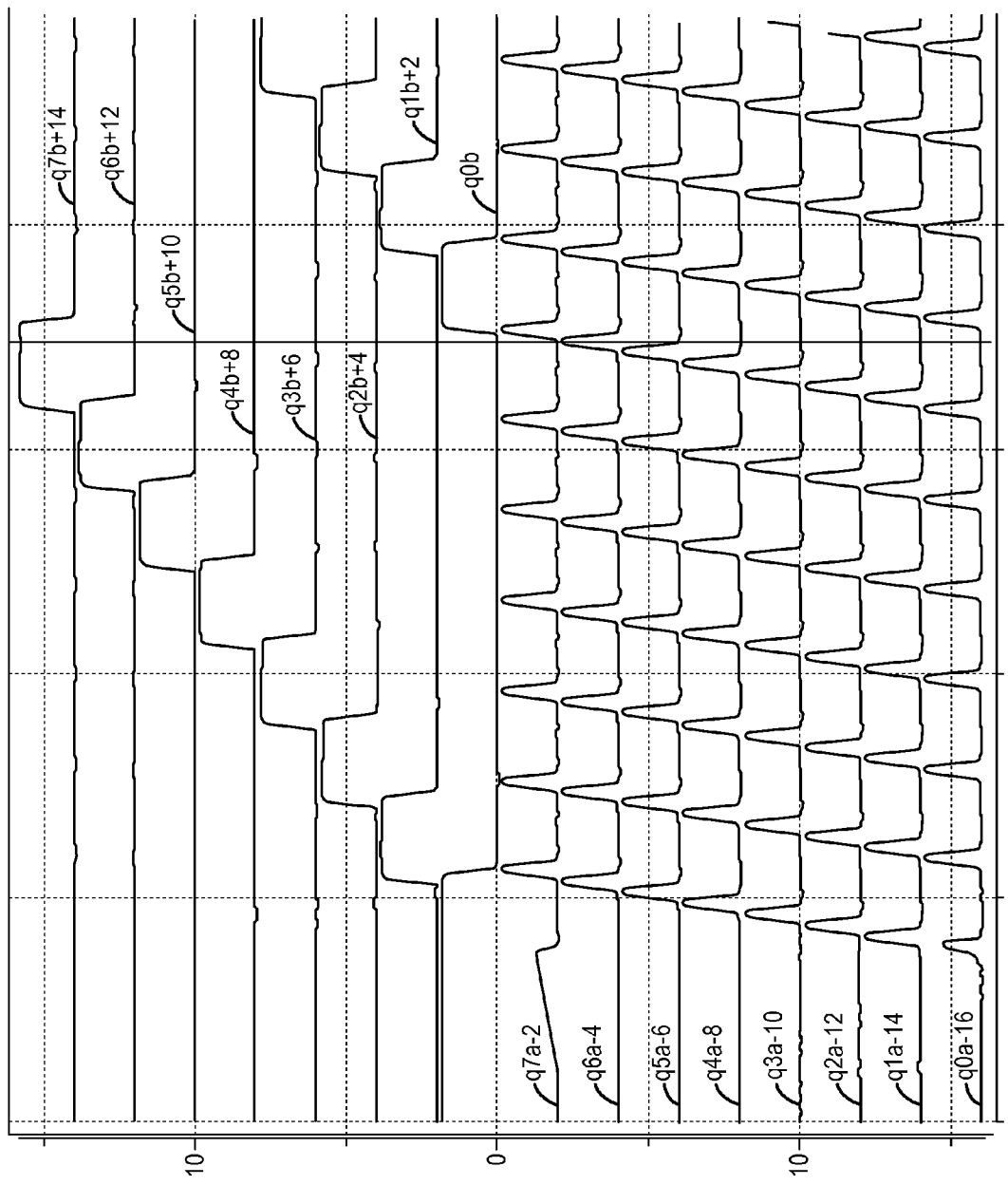
FIG. 16B shows a timing diagram for the divide-by-28 function of FIG. 7A.

FIG. 16A shows a divide-by-28 function with an example of a static spot stage. The divide-by-28 function is performed in a two-stage contra-flow precession divider, wherein the first divider rotates in a direction opposite to the second divider. The first divider 302 has 8 spot stages and advances the spot through all of the stages in 8 phases of a two-phase clock, thus implementing a divide-by-4. The second divider 304 has 8 spot stages and has the monotonic phase sequence of 0, 7, 14, 21, 28, 35, 42, 49, 50 (0), which indicates that the spot takes 56 phases of the first divider to advance through all the stages of the divider. Because the first divider 302 takes 8 phases to advance through all the stages, the second divider 304 implements a divide-by-7. Therefore, overall the divider ratio is 28 relative to the cycles of the two-phase clock. A pair of PMOS gates 306 are shown connected to the input of one of the stages of each of the dividers. These transistors 306 are used to initialize the spot in the divider. The static spot stage 308 in the drawing includes NMOS elk 310 and d transistors 312, PMOS pullup 314 and output transistors 316, a flip-flop 318, an inverter 320, an NMOS reset transistor 322, and an NMOS clr transistor 324. The clk, d and PMOS pullup transistors 310, 312, 314 have their channels connected in series between Vdd and ground, with the clk input connected to the gate of the clk transistor 310 and d input connected the gate of the d transistor 312. The output transistor 316 has its gate connected to the junction of the clk transistor 310 and pullup transistor 314 and its channel connected between stage output node Q 326 and the supply voltage. The flip-flop 318 is connected to the stage output node 326 and the inverter 320 is connected between the flip-flop 315 and the NMOS clr transistor 324, whose channel is connected between the gate of the d transistor 312 and ground. In operation, when the clk input and d input are both high, indicating the presence of a spot in the previous stage and a clock signal for advancing the spot, the gate of the output transistor 316 is pulled towards ground, causing the stage output node Q 326 to go high. This, in turn, causes the flip-flop 318 to latch the high state on the output node and the inverter 320 to drive a high on the gate of the clr transistor 324, thus turning it on. The clear transistor 324 removes the high on the gate of the d transistor 312, thereby removing the spot from the previous stage. The spot is now present in the current stage. FIG. 16B shows a timing diagram for the divide-by-28 function of FIG. 16A.

EXTENDED SPOT DIVIDER

Figure 17:
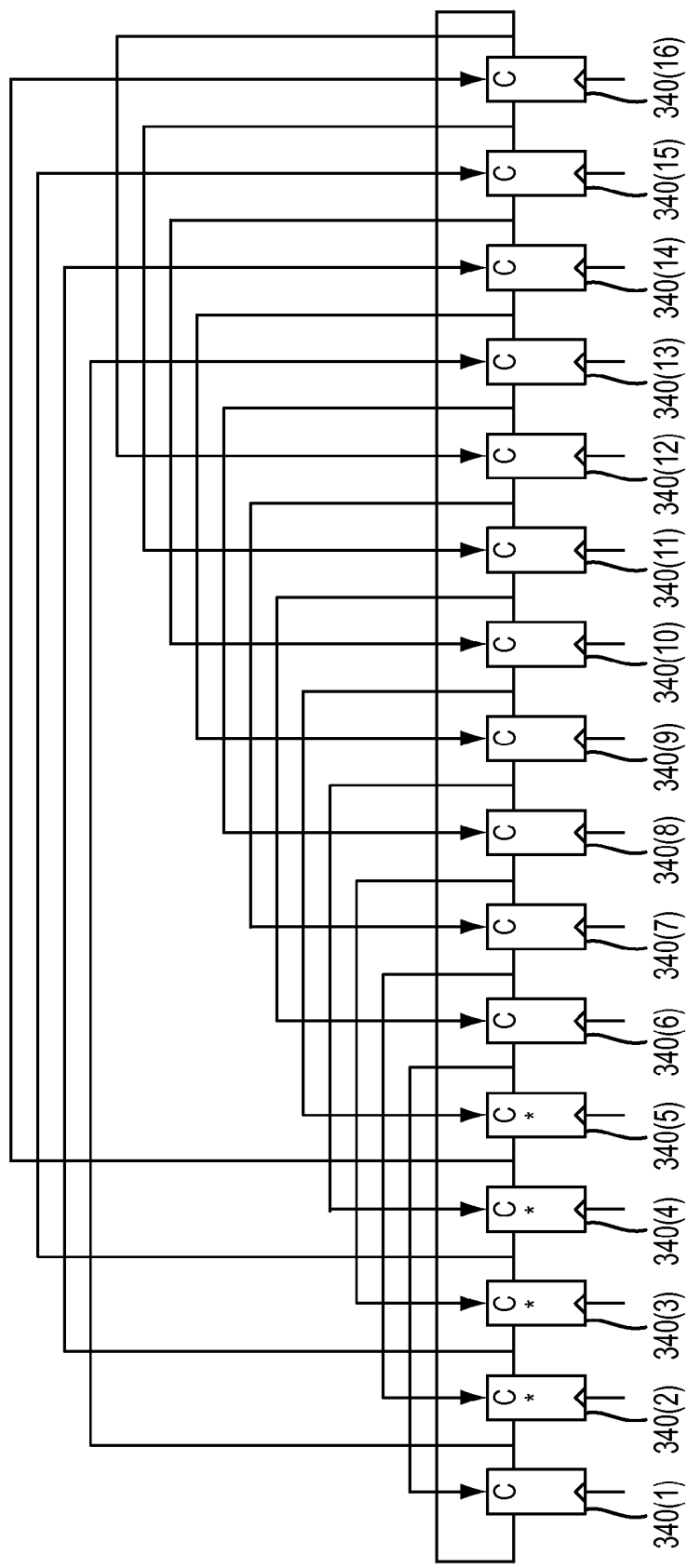
FIG. 17 shows an extended spot divider.

FIG. 17 shows an extended spot divider. In this type of divider, instead of only one stage carrying the "one" or spot, a group of stages carries an "extended spot." For example, if a ring has sixteen stages 340(1-16), four of the stages 340(2-5) can carry the "one" or spot. This extended spot then moves as a group stage-by-stage through the ring. The divider ratio of the ring does not change because it takes the same number of phases to advance extended spot through all the stages in the ring. The difference between an extended spot divider and a single spot divider is that each stage must not clear the previous adjacent stage but instead clear the stage adjacent to the last spot of the group. Thus, as shown in FIG. 15, if the extended spot is four stages, then the stage at the front of the group must clear the stage behind the last stage of the group and this is true for each stage of the ring.

DIRECTION CONTROL

Figure 18A:
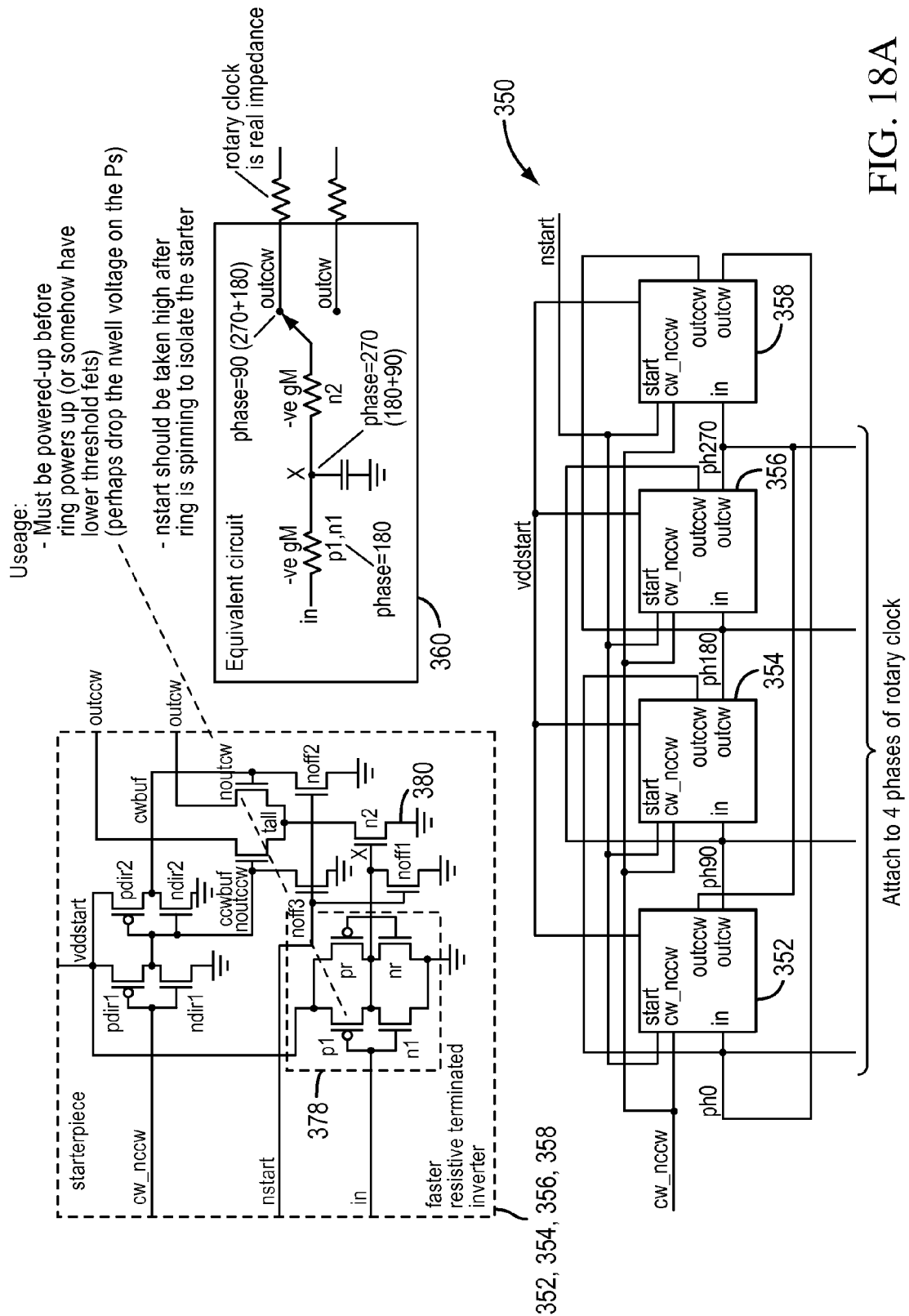
FIGS. 18A and 18B shows circuitry for starting the rotation of a rotary oscillator.
Figure 18B:
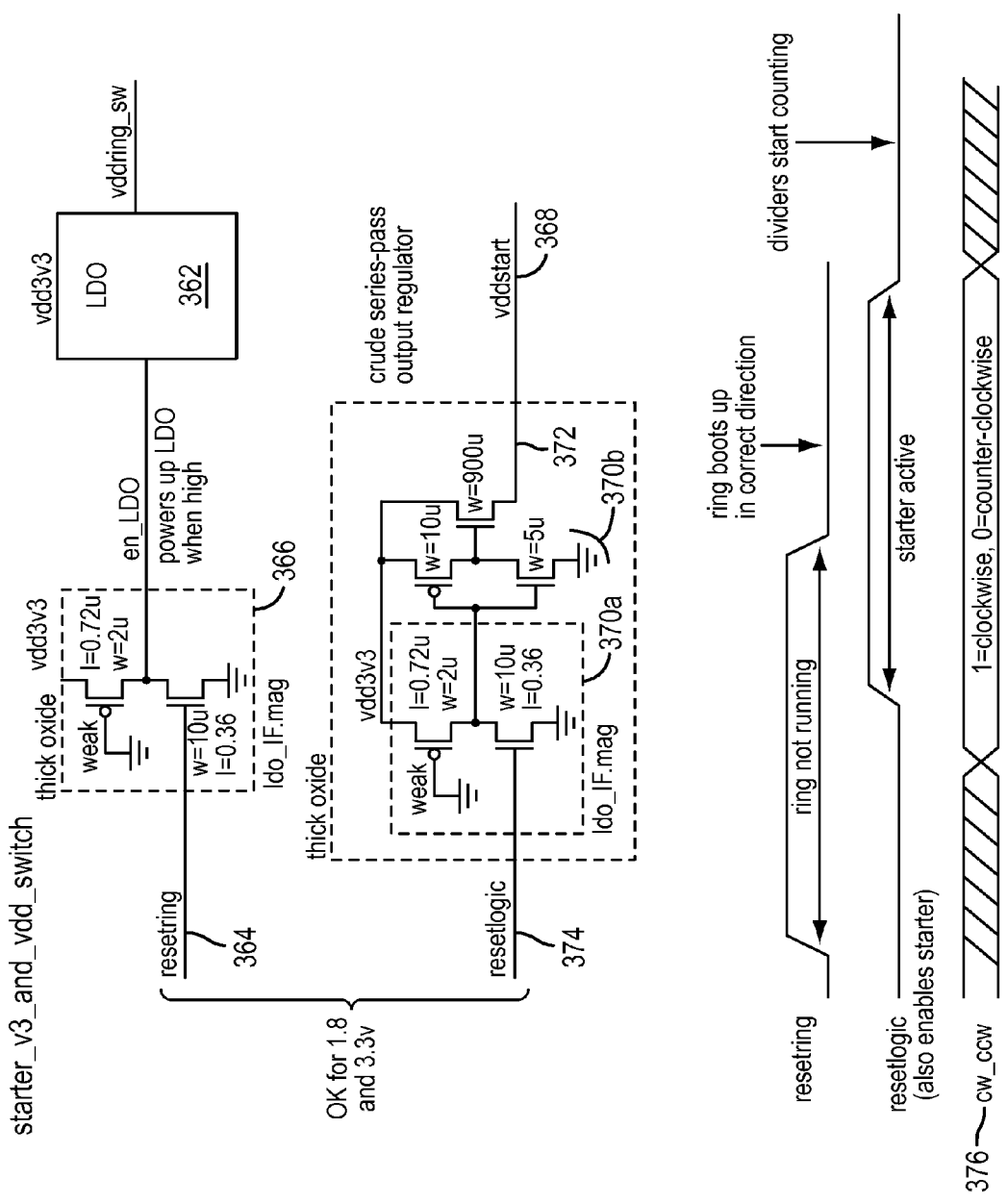

FIGS. 18A and 18B show circuitry for starting the rotation of a rotary oscillator. As mentioned above, different divider ratios are possible depending on the direction of the multiphase clock that drives the moving spot divider. For example, if there is a 10-stage ring driven by a four-phase clock with the monotonic phase sequence 0 1 3 4 6 7 9 10 12 13 15 16 18 19 21 22 24(0) a divide-by-six is implemented because it takes 24 phases of the four-phase clock to advance the spot through all the stages. However, if the multiphase clock has its direction reversed, then the monotonic phase sequence 0 3 5 8 10 13 15 18 20 23 25 28 30 33 35 38 40(0) resulting in a divide-by-10 (because it takes 40 phases of the four-phase clock to move the spot through all the stages). As a result it is important that the rotation direction of the multi-phase oscillator be controllable so that these different divider ratios can be implemented. FIGS. 18A and 18B show circuitry for realizing this. The circuitry includes, in the embodiment shown, four stages 352-385 in a starter circuit 350 that is attached directly to the clocks )ph0, ph90, ph180, ph270) of the multi-phase oscillator, which is assumed to be a rotary traveling wave oscillator. Each of the stages 352-358 in the starter circuit 350 includes a 90 degree phase shifting circuit, whose equivalent 360 is shown in the inset. The starter circuit 350 is connected to the rotary oscillator such that the direction of rotation can be chosen, at startup, to be either clockwise or counter clockwise. Thus, in the first stage 352 of the starter circuit 350, the input is ph0 and the output is either ph90 for clockwise or ph270 for counter clockwise. For the second stage 354, the input is ph90 and the output is either ph180 for clockwise or ph0 for counter clockwise. For the third stage 356, the input is ph180 and the output is either ph270 and the output is either ph0 or ph180 for counter clockwise. Each stage 352-358 has an input cw_nccw for selecting the direction of rotation of the rotary oscillator. The input nstart is used to enable the operation of the stage and connection ndds tart provides power to each of the stages.

A low drop out regulator (LDO) 362, shown in FIG. 18B, provides power to the rotary oscillator and this regulator 362 is enabled to operate by the resetring signal 364 via an inverter 366. The signal vddstart 368 is driven from a pair of inverters 370a, b and a source follower 372, the first inverter 370a of which has the resetlogic signal as its input.

The starter circuitry 350 operates as follows. First, the resetring signal 364 is made active. This powers down the LDO and therefore, the rotary oscillator. While the resetring signal 364 is active, the resetlogic signal 374 is made active along with the direction signal cw_ccw 376. This powers up the source follower 372 to provide power to the starter circuit 350 and set the direction. However, at this point, all of the phase signals from the rotary oscillator are inactive. Next, the rotary oscillator is powered up via the LDo 362. The causes the starter circuit 350 to urge the 90 degree phase sifts in each stage 352-358 between input and output signals of that stage. Thus, in the clockwise direction, a 90 degree phase shift is urged between the ph0 and ph90 signals from the rotary oscillator, and similarly for the other stages. Once the rotary oscillator begins operation in a particular direction, then starter circuit is powered down to save power.

Each stage of the starter circuitry 350 includes a first negative resistance device effectively connected to a capacitive load followed in a series by a second negative resistance device. This gives a net of +90 degrees of phase shift for each stage. The first negative resistance device 378 is the pair or transistors pl, nl, which is biased by transistors pr and nr. The second negative resistance device is transistor n2 380, an open drain output that is connected to the output switch which comprises transistors noutccw and noutcw.

TIME-TO-TIME DIGITAL CONVERTER

Figure 19A:
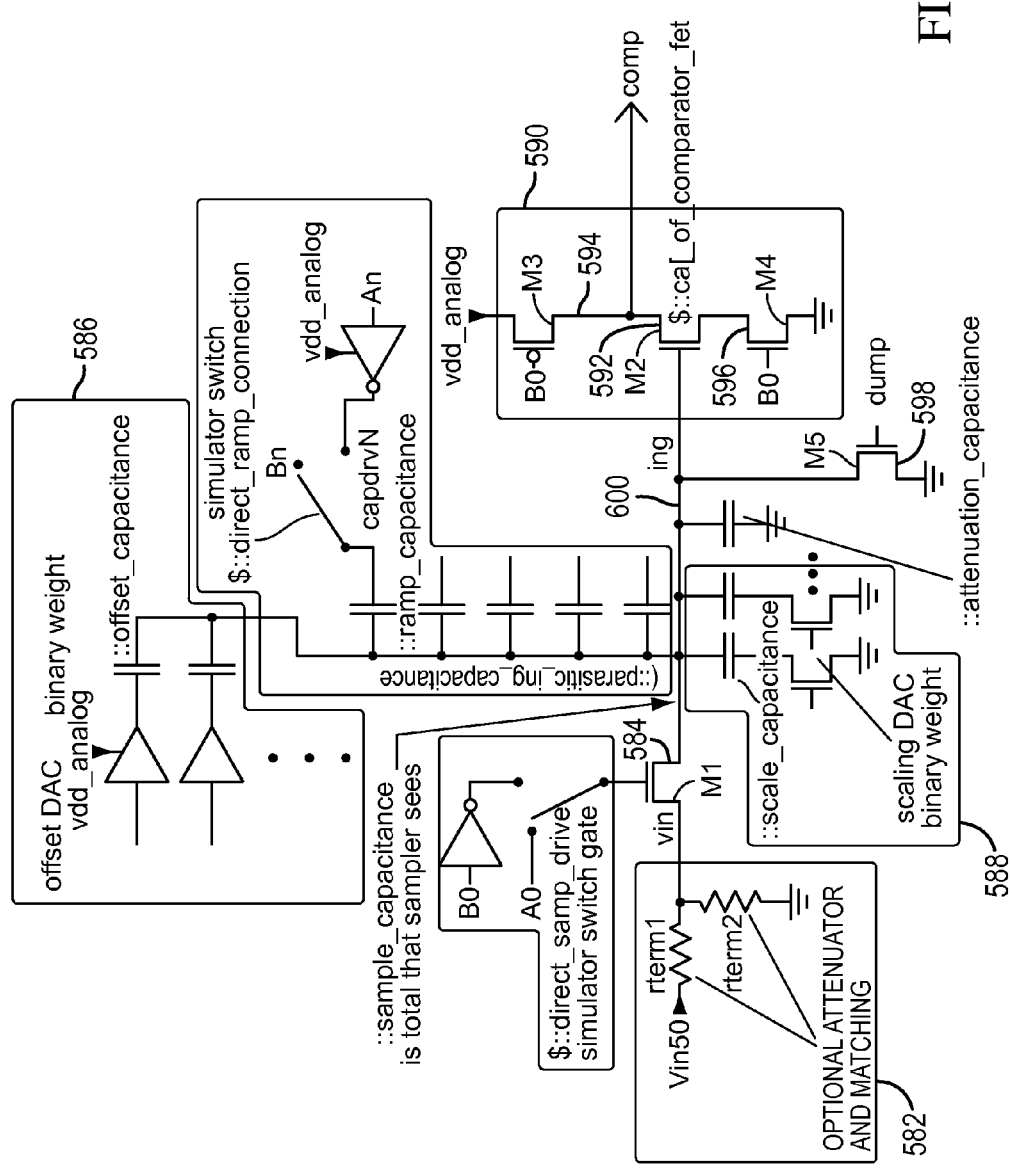

FIGS. 19A and 19B show a more complex implementation 580 of an ADC in accordance with an embodiment of the present invention. A number of additional features are present. First, an optional attenuator and matching circuit 582 is connected to the channel of the sampling transistor 584. Second, an offset DAC 586 and a scaling DAC 588 along with associated circuitry is present. Third, the comparator 590 includes three transistors, M2 592, M3 594, M4 596, instead of one. Fourth, a charge dumping transistor M5 598 is added to the ing node 600. Fifth, a set 602 of precharge transistors is added, one for each of the time-sampling transistors $M_{AO}$-$M_{AN}$ 604. Sixth, a set of buffers and pass transistors 606 are added to the existing set of buffers to pipeline the digital code. Finally, a number of switches are (i.e., 608, 610) added for testing purposes.

FIG. 19B shows one embodiment of the time-to-digital converter (TDC) portion of the circuit. In addition to the time sampling transistors $M_{AO}$-$M_{AN}$ 604, a set of precharge transistors 602, one for each of the sampling transistors, and a set of pipelined buffers 606 are present. Each of the precharge transistors 602 has a channel connected between the supply voltage and the output of one of the sampling transistors 604. The gates of all of the precharge transistors 602 are connected to the sampling signal that drives the gate of the sampling transistor, M1 584, so that during the sampling interval, the output nodes of the time-sampling transistors 604 cmpbit0-N are precharged to the supply voltage. During the conversion interval, the output of the comparator 590 is time-sampled by each of the phases AO-AN from the multi-phase oscillator. If the output of the comparator 590 is high at the time of the sample, then the precharged output of the time sampling transistor (in 104) stays high and the high is input into the buffer 60. If the output of the comparator is low at the time of the time sample, the precharged output is pulled low and the low is input into the buffer 600. As the output of the comparator falls, the time sampling transistors sample the comparator output and some of the sampling transistors sense a high signal and some of the sampling transistors detect a low signal, depending on the threshold of the buffers 660. The precise point at which the comparator 590 output changes state is resolved down to the nearest phase of the multi-phase clock. The code that is obtained by the time-sampling process is then clocked into a second set of buffers 606, via pass transistors QAO-QAN (in 606), and advantageously stored in a latch for further processing.

If accuracy beyond what is available from the multi-phase clock is desired, a set of flash ADCs can be used in a second stage of conversion. The voltage that is captured by each of the time-sampling transistors is a source of additional data from which the additional accuracy can be obtained. Small ADCs, say two-bit converters, connected to the output of each time-sampling transistor, are used to extract the extra bits of accuracy. These additional bits are combined with those of the thermometer code for additional resolution as to the precise time at which a transition of the comp signal occurred. While this involves a number of ADCs, the extra power can be minimal, as only one ADC is enabled based on the thermometer code bits on either side of the transition.

WAVEFORMS FOR TDC

FIG. 4B shows the waveforms 620 for the time-to-digital conversion process. Signals A0-A10 122 are taken from the multi-phase clock, preferable a rotary traveling wave oscillator. At the falling transition of each of these signals, a time sample of the comparator 612 output is taken. In the figure, cmpbit0..3 124 are all high because the sampling signals A0-A3 have turned off before the transition of the comparator output, cmpbit4-7 126 sample the transition of the comparator output, with some high and some low, depending on the timing of the sampling signals A4-A7 and the threshold of the buffer, and cmpbit8..10 628 are all low, because the sampling signals A8-A10 have turned off after the transition of the comparator output. As described above, the output of the buffers is a digital thermometer code, cmpbit0-10 which equals '11111100000', in the figure.

DIGITAL DIVIDER

Figure 20A:
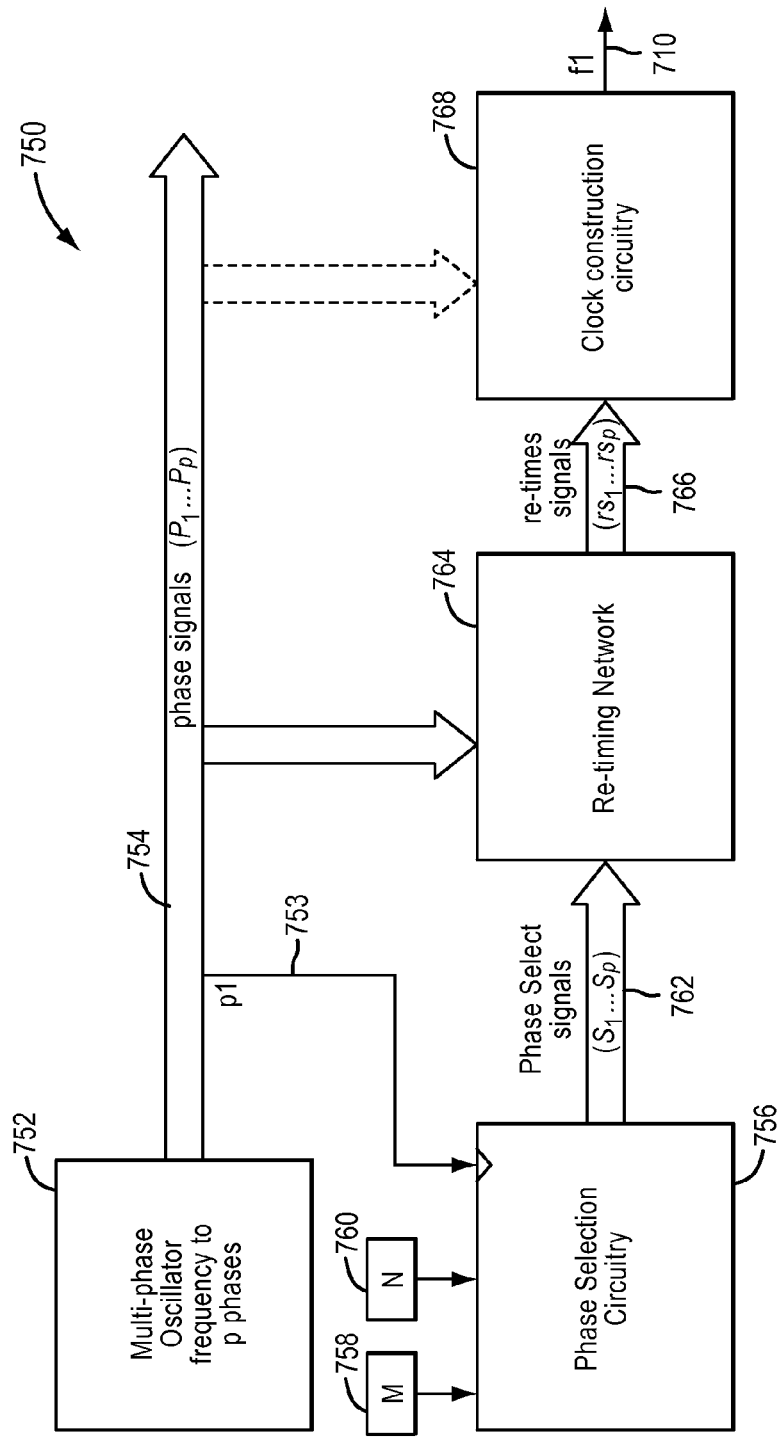
FIG. 20A shows block diagram in accordance with an embodiment of the present invention.

FIG. 20A shows block diagram the circuitry 750 of the present invention. The blocks include a multi-phase oscillator 752, phase selection circuitry 756, a retiming network block 764, and clock construction circuitry 768.

The multi-phase oscillator 752 provides a plurality p of phases, $(p_L...P_P)$ 754, at a given frequency $F_O$. In one embodiment, the multi-phase oscillator 752 is a rotary traveling wave oscillator described in U.S. Pat. No. 6,556,089.

The phase selection circuitry 756 is clocked by one of the phases (pl is shown) of the oscillator and, using the two integers M 758 and N 760, provides the p phase select signals $s_1...s_p$ 62, only one of which is active at any given time. The phase selection circuitry 756 implements an algorithm that prevents errors from accumulating in the synthesized frequency by selecting, at each selection time, a phase with the least error. A selection time is the point in time at which a transition of the output frequency is required. Thus, if the output frequency has a period that is 4.25 times the period of the input frequency, then there is a selection point every 4.25 cycles of the input frequency.

The retiming network 764 receives the p phase select signals $(s, ...s_p)$ 762 from the phase selection circuitry 756 and the p phases $(p_1...p_p)$ 754 on the multi-phase oscillator 752 and positions, in time, the phase select signals to have a phase that is consistent with the phase being selected by the signal. Thus, if a phase 2 select signal is active, then it is re-timed to occur on phase 2 of the multi-phase oscillator. The re-timed signals 766 are designated $(rs_L...re_p)$.

The clock construction circuitry 768 receives the p mimed select signals $(rs_L...rs_p)$766 and optionally, the phase signals 754 from the multi-phase oscillator 752, to construct the synthesized clock $f_1$ 770 at the desired frequency $f_1=(M/N)f_0$, where M 758 and N 760 are integers and the ratio M/N is less than 1.

Figure 20B:
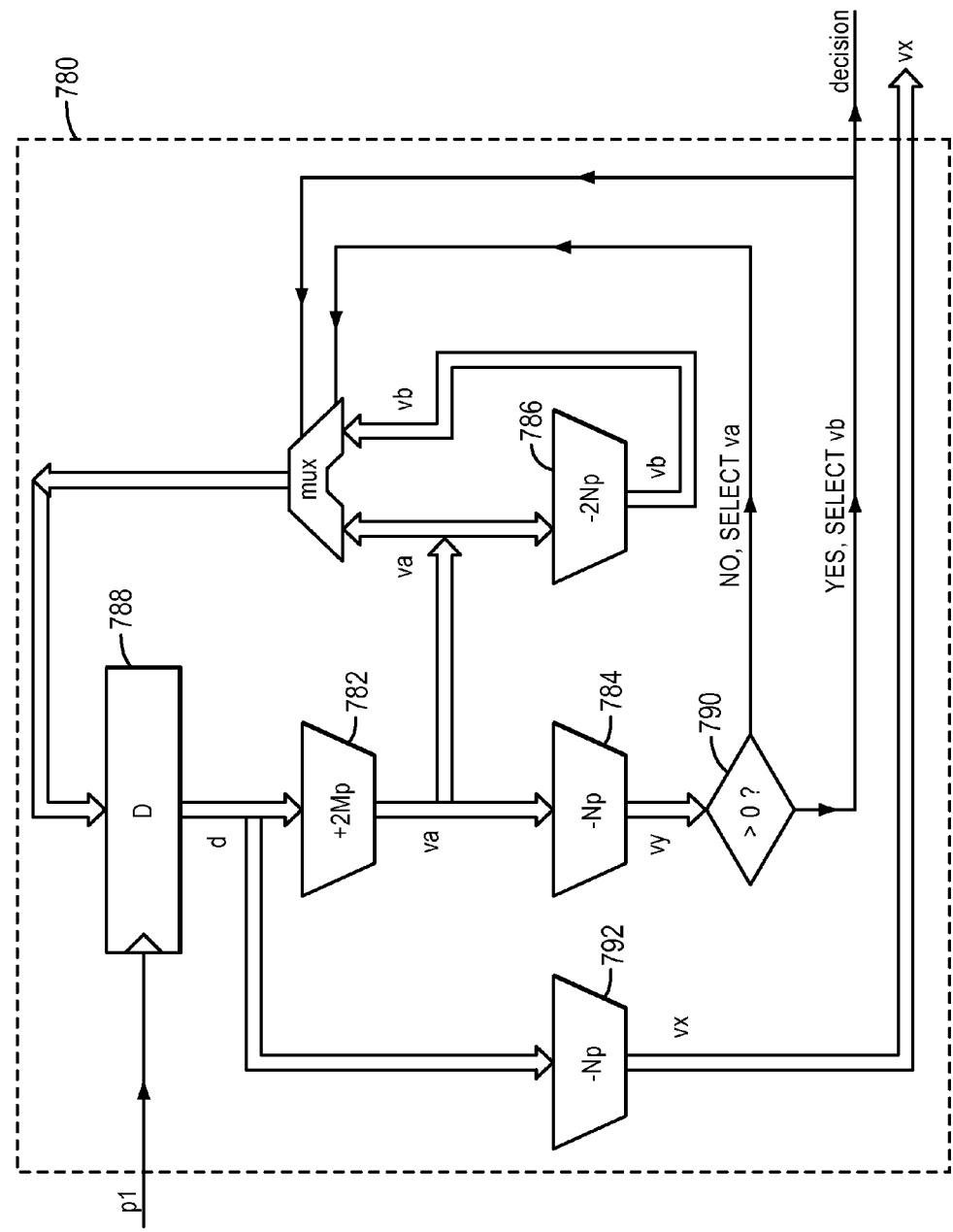
FIG. 20B shows an embodiment of the state machine circuitry for use in the phase selection circuitry of the present invention.

FIG. 20B shows an embodiment of the state machine circuitry 780 for use in the phase selection circuitry 756 of the present invention. The state machine circuitry 780 comprises a collection of adders and multipliers 782, 784, 786 and an accumulator, called the D-register 788, for holding an accumulating decision parameter used by the phase select retiming network to create the phase select outputs. The adders and multipliers 782, 784, 786 operate on the integers M and N supplied to the state machine to implement an algorithm for selecting the phase with the least error in the construction of the new frequency. In one embodiment, the Bresenham line drawing algorithm is used.

Figure 20C:
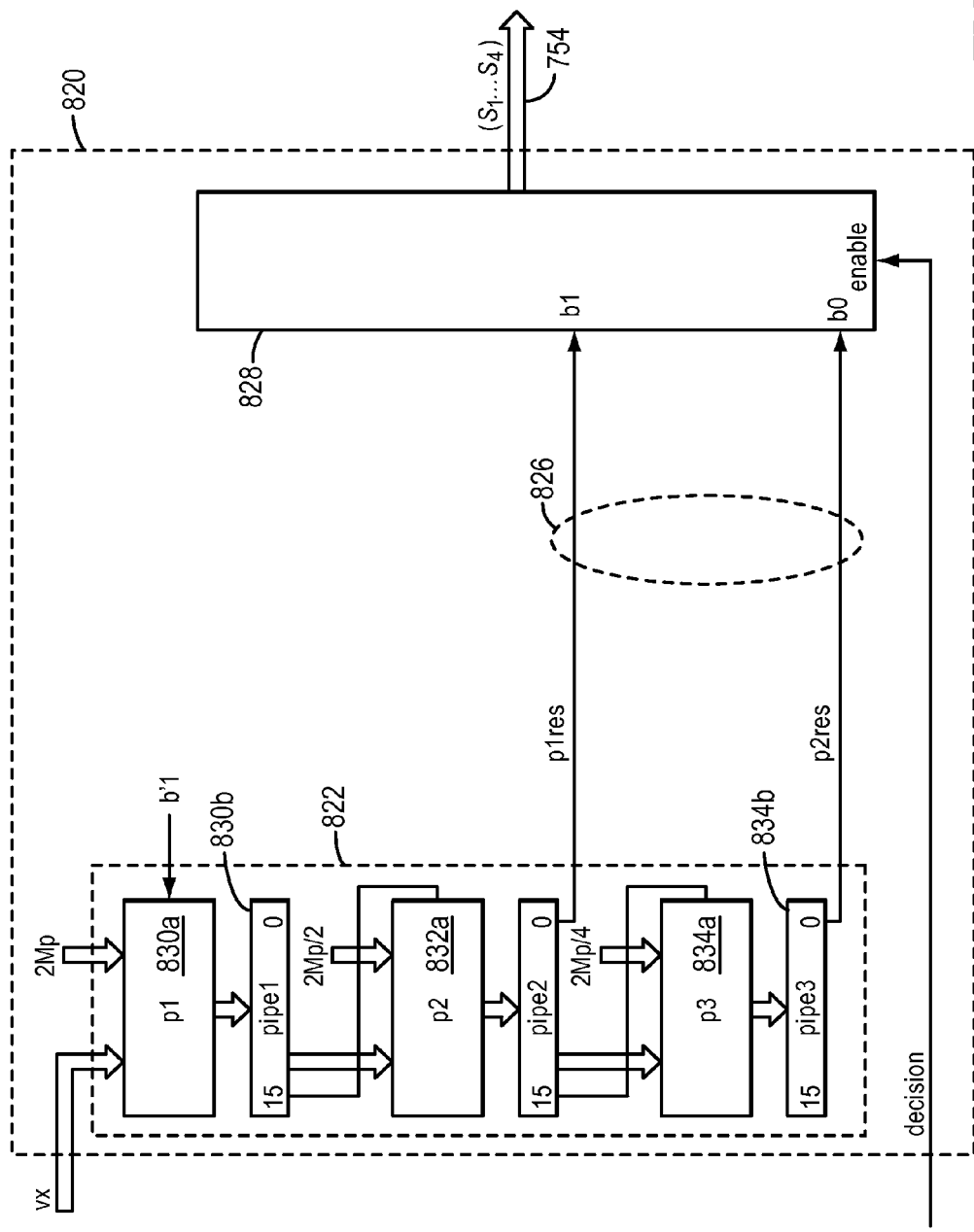
FIG. 20C shows an embodiment of the encoding and decoding circuitry for use in the phase selection circuitry of the present invention.

FIG. 20C shows an embodiment of the encoding and decoding circuitry 820 for use in the phase selection circuitry of the present invention. The encoding and decoding circuitry includes a D-to-binary conversion block 822 that receives the contents of the D register, less than quantity Np (vx bus), and creates a p-bit binary number 826 (two bits, b1b0, for the example shown) for the next phase select signal to be activated. While the example shown is for two bits, the number of bits depends on the number of phases into which a cycle of the multi-phase clock is divided. The binary decoder 828 then receives the binary number for the next phase select signal and decodes it into the p phase select signals $(s_L...s_P)$ 754. According to the diagram, the p phase select signals 754 are enabled to be active from the decoder 828 when the circuitry 790 in FIG. 2B detects a greater than zero condition for the current value of D+2Mp−Np (decision=true).

Figure 20D:
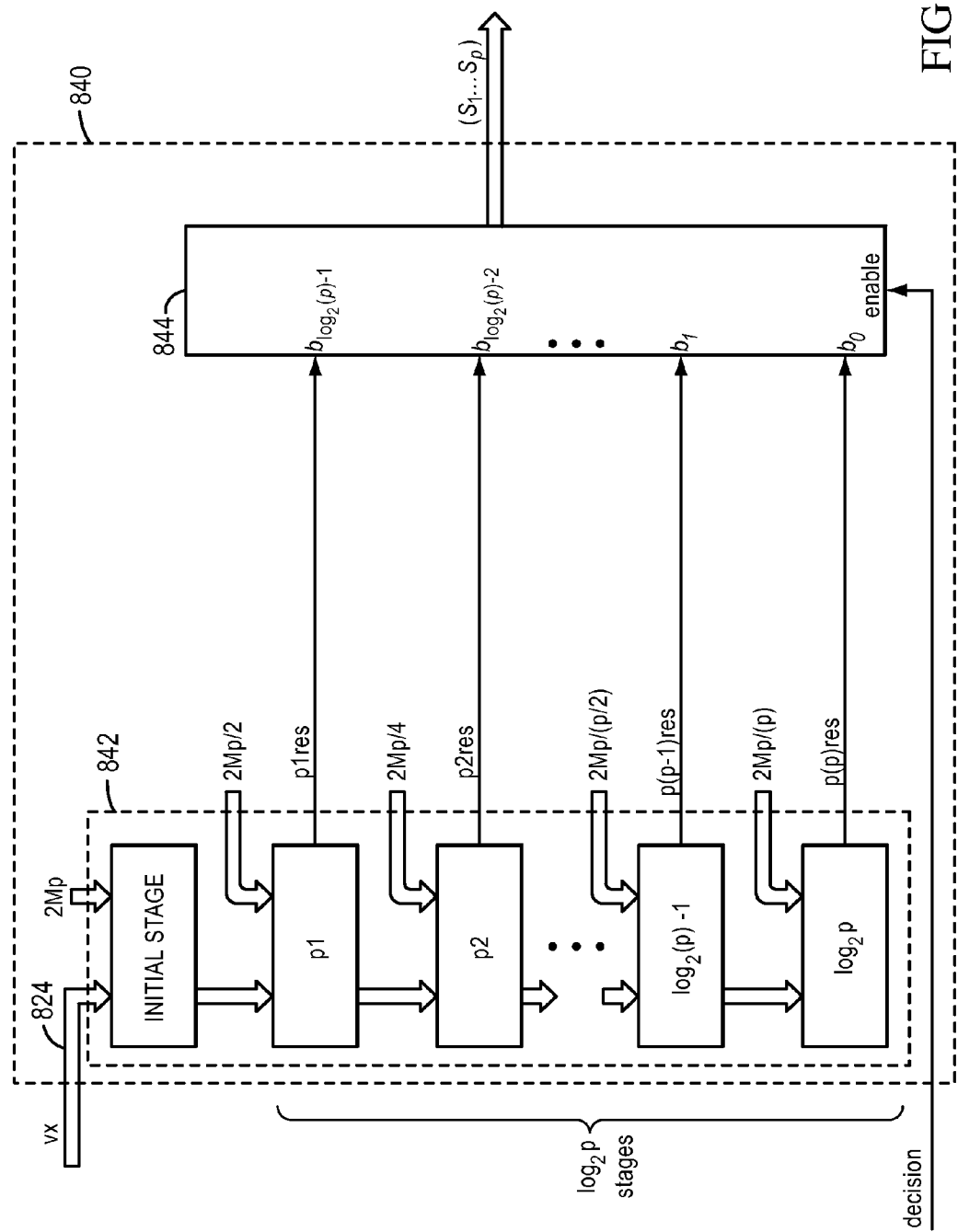
FIG. 20D shows a general embodiment of the encoding and decoding circuitry for use in the phase selection circuitry of the present invention.

FIG. 20D shows a general embodiment 840 of the encoding decoding circuitry for use in the phase selection circuitry of the present invention. There is an initial stage for computing the parameter e (a starting number), and then log, p binary signals, one from each of the stages.

The numeric values for 2Mp, 2Np, the initial value $E_1$, and the correction when y is incremented, respectively, are:

$2Mp=32, 2Np=136$ $e_1=2Mp-Np=-36$ $2Mp-2Np=-104,$ which gives the following table, Inspection of the table shows how the phase to be selected advances every 17 phase steps. For the first 17 phases, phase 2 is the proper selection for the transition of the output frequency. For the second 17 phases, phase 3 is the proper selection for the transition; for the third 17 phases, phase 4, and for the fourth 17 phases, phase 1. To make the generation of the phase select signals easier, the error value e has the initial offset $e_1$ removed in the D column, and the implementation in FIG. 20B reflects this. Also, it should be noted that the numbers in the cycle column of the table represent a count of the cycles of the input oscillator, which is ¼ the number of phase steps, in the example. This has the advantage of filtering out all but one point at which the parameter e (D-register less the initial offset) turns positive during the output period.

Although the present invention has been described in considerable detail with reference to certain preferred versions thereof, other versions are possible. The ideas presented are general and are presented as an analog embodiment, but to someone experience in the art, substitution of digital control and digital filtering is within the scope of the invention. Also, within the scope of the invention are the use of various division ratios in the PLLs to affect integer and non-integer divide/multiply ratios. Therefore, the spirit and scope of the appended claims should not be limited to the description of the preferred versions contained herein.

What is claimed is:

1. A circuit for filtering phase noise of an input frequency, the circuit comprising:
    means for generating a plurality of oscillator signals, each having the same frequency and a different phase, said frequency being a first frequency;
    means for frequency translating the first frequency to provide a translated frequency that is either a sum or difference of the first frequency and a second frequency in response to an ordered selection of the different phases of the oscillator signals by the second frequency;
    first means for comparing said sum or difference frequency to a reference frequency;
    first means for filtering said first comparing means;
    means for adjusting frequency of said generating means in response to the first filtering means;
    second means for comparing one of said oscillator signals to the input frequency;
    second means for filtering said second comparing means; and
    means for providing the second frequency adjustably responsive to said second filtering means.

2. A circuit for filtering phase noise as recited in claim 1, wherein the frequency translating means includes:
    a phase multiplexer having a plurality of selection inputs, a plurality of phase inputs each connected to one of the oscillator signal phases and a selection output; and
    state circuitry that activates, in response to the offset frequency providing means, selection inputs of the phase multiplexer, at a constant rate and in a particular order, to select one of a plurality of phases of said generating means.

3. A circuit for filtering phase noise as recited in claim 2, wherein the state circuitry includes a multistage moving spot divider having a single moving spot.

4. A circuit for filtering phase noise as recited in claim 2, wherein the state circuitry includes a binary counter.

5. A circuit for filtering phase noise as recited in claim 2, wherein the state circuitry includes a multistage moving spot divider having a group of moving spots.

6. A circuit for filtering phase noise as recited in claim 1, wherein first and second comparing means each includes a phase detector.

7. A circuit for filtering phase noise as recited in claim 1, wherein first and second filtering means each includes:
    a resistor having a first node that receives an input signal and a second node that provides an output signal; and
    a capacitor connected to the second node and a reference voltage.

8. A circuit for filtering phase noise as recited in claim 1, wherein first filtering means includes:
    a first RC circuit for providing a first control voltage;
    a second RC circuit for providing a second control voltage;
    wherein first control voltage is responsive to said first comparing means during a first time interval and second control voltage is responsive to said first comparing means during a second time interval;
    wherein second control voltage follows the first control voltage with an offset during the first time interval and first control voltage follows the second control voltage with an offset during the second time interval; and
    wherein adjusting means is responsive to both first and second control voltages to adjust the generating means.

9. A circuit for filtering phase noise as recited in claim 8, wherein adjusting means includes:
    a plurality of voltage-controlled capacitors, each capacitor having an output connected to the generating means and a control input that adjusts the capacitance provided by the capacitor;
    a bidirectional shift register;
    means, connected between first the RC and the second RC circuits, for detecting conditions of first and second control voltages and for shifting said shift register in response to said conditions; and
    means for selecting a first reference voltage, a second reference voltage or one of the first or second control voltages for controlling the voltage-controlled capacitors in response to the contents of the bidirectional shift register;
    wherein the contents of the shift register determines the frequency of the generating means.

10. A circuit for filtering phase noise as recited in claim 1, wherein the means for generating a plurality of oscillator signals is a rotary traveling wave oscillator.

11. A circuit for filtering phase noise as recited in claim 1, wherein the bandwidth of the first filter means is greater than the bandwidth of the second filter means.

12. A circuit for filtering phase noise of an input frequency, the circuit comprising:
    means for generating a plurality of oscillator signals, each having the same frequency and a different phase, said frequency being a first frequency;
    means for translating the first frequency to provide a translated frequency that is either a sum or difference of the first frequency and a second frequency in response to an ordered selection of the different phases of the oscillator signals by the second frequency;
    means for frequency dividing the translated frequency;
    first means for comparing said divided translated frequency to a reference frequency;
    first means for filtering first said comparing means;

means for adjusting the frequency of said generating means in response to the first filtering means;

second means for comparing one of said oscillator signals to the input frequency;

second means for filtering second said comparing means; and means for providing the second frequency that is adjustable in response to said second filtering means.

13. A circuit for filtering phase noise of an input frequency, the circuit comprising:

means for generating a plurality of oscillator signals, each having the same frequency and a different phase, said frequency being a first frequency;

means for translating the first frequency to provide a translated frequency that is either a sum or difference of the first frequency and a divided second frequency in response to an ordered selection of the different phases of the oscillator signals by the divided second frequency;

first means for comparing said translated frequency to a reference frequency;

first means for filtering first said comparing means;

means for adjusting the frequency of said generating means in response to the first filtering means;

second means for comparing one of said oscillator signals to the input frequency;

second means for filtering second said comparing means; [and]

means for providing the second frequency that is adjustable in response to said second filtering means; and means for frequency dividing said second frequency to provide the divided second frequency.

14. A circuit for filtering phase noise of an input frequency, the circuit comprising:

means for generating a plurality of oscillator signals, each having the same frequency and a different phase, said frequency being a first frequency;

means for translating the first frequency to provide a translated frequency that is either a sum or difference of the first frequency and a second frequency in response to an ordered selection of the different phases of the oscillator signals by the second frequency;

first means for comparing said translated frequency to a reference frequency;

first means for filtering said comparing means;

means for adjusting the frequency of said generating means in response to the first said filtering means;

means for frequency dividing one of said plurality of oscillator signals;

second means for comparing said frequency divided oscillator signal to the input frequency;

second means for filtering second said comparing means; and means for providing the second frequency in response to said second filtering means.

15. A circuit for filtering phase noise of an input frequency, comprising:

a first phase locked loop that includes:

a multi-phase VCO operative to provide a plurality of phase signals, each having the same frequency, said multi-phase VCO having a first frequency control input;

a frequency translation circuit operative to translate the frequency of the multi-phase VCO to provide on an output a translated frequency that is either a sum or difference of the first frequency and a second frequency;

a first phase/frequency detector operative to detect any difference in frequency or phase between a reference frequency and the translated frequency and provide an output indicating the detected difference;

a first low pass filter operative to filter the output of the first phase/frequency detector and provide at least one voltage indicating the filtered difference in frequency;

a control circuit operative to control the frequency and phase of the multi-phase VCO in response to the output from the low pass filter; and a second phase locked loop that includes:

a second VCO operative to provide the second frequency in response to a second frequency control input;

a second phase/frequency detector operative to detect any difference in frequency or phase between the input frequency and the frequency of the multi-phase VCO and provide an output indicating the detected difference; and a second low pass filter operative to filter the output of the second phase/frequency detector and control, via the second frequency control input, the frequency and phase of the second VCO;

wherein one of said phase signals is a filtered version of the input frequency.

16. A circuit for filtering phase noise of an input frequency as recited in claim 15, wherein the frequency translation circuit includes:

a phase selector for selecting one of a plurality of phase signals of the multiphase VCO and providing the selected phase on an output in response to a plurality of selection signals; and state circuitry for providing the plurality of selection signals in a particular order to the phase selector in response to the offset frequency signal from the second VCO;

wherein the frequency translation circuit provides either the sum or difference frequency depending on the order of selection signals provided by the state circuitry.

17. A circuit for filtering phase noise as recited in claim 16, wherein the state circuitry includes a multistage moving spot divider.

18. A circuit for filtering phase noise as recited in claim 16, wherein the state circuitry includes a binary counter.

19. A circuit for filtering phase noise as recited in claim 16, wherein first low pass filter includes a first RC circuit for providing a first control voltage;

a second RC circuit for providing a second control voltage;

wherein first control voltage is responsive to said first phase/frequency detector during a first time interval and second control voltage is responsive to said first phase/frequency detector during a second time interval;

wherein second control voltage follows the first control voltage with an offset during the first time interval and first control voltage follows the second control voltage with an offset during the second time interval; and wherein the control circuit is responsive to both first and second control voltages to adjust the multiphase VCO.

20. A circuit for filtering phase noise as recited in claim 17, wherein the control circuit includes:

a plurality of voltage-controlled capacitors each having an output connected to the generating means, each having a control input that adjusts the capacitance provided by the capacitor;

a plurality of multiplexers each having a first input that is connected to a first reference voltage and a second input that is connected to a second reference voltage, each of the even numbered multiplexers having a third input connected to the first control voltage and each of the odd numbered multiplexers having a third input connected to the second control voltage, each of said multiplexers having an output connected to the control input of one of the voltage controlled capacitors and a plurality of selection inputs for connecting the first, second or third input to the output;

a bidirectional shift register;

means, connected between first RC and second RC circuit, for shifting said shift register; and a decoder that is operative to decode the contents of the shift register to control the selection inputs of the plurality of multiplexers;

wherein the contents of the shift register determines the frequency of the multiphase VCO.

21. A digital phase locked loop comprising:

a rotary oscillator for providing a plurality of phase signals each having the same frequency, said frequency of the rotary oscillator being responsive to a plurality of frequency control signals;

a time to digital (TTD) converter circuit connected to the phase signals of the rotary oscillator and providing a digital signal that represents the phase signals of the rotary oscillator at a transition of a reference frequency signal;

a counter connected to one of the phase signals of the rotary oscillator and providing a digital signal that represents the number of cycles between a first and a second transition of the reference frequency signal; and a digital processing unit that receives the TTD digital signal and the counter digital signal and provides the frequency control signals to the rotary oscillator such that the rotary oscillator is phase and frequency locked to the reference frequency signal.

22. A method of filtering phase noise of an input frequency, the method comprising:

frequency and phase locking a translated frequency to a reference frequency having a first phase noise characteristic over a first bandwidth, wherein said translated frequency is either the sum or the difference of a first frequency of a first oscillator having a plurality of phases and a second phase noise characteristic over a second bandwidth and a second frequency of a second oscillator, wherein said translated frequency is generated in response to an ordered selection of the different phases of the first oscillator by the second frequency, wherein one of the phases of the first oscillator is an output having substantially the first and second phase noise characteristics; and frequency and phase locking the input frequency to the filtered output of the first oscillator to set the frequency of the second oscillator.

23. A method of filtering phase noise as recited in claim 20, wherein the multiphase oscillator is a rotary traveling wave oscillator.

24. A circuit for filtering phase noise of an input frequency, the circuit comprising:

a first oscillator having a plurality of phase signals and an adjustment input, and operating at a first frequency;

a frequency translation circuit that translates the first frequency to provide a translated frequency that is either the sum or difference of the first frequency and a second frequency in response to an ordered selection of the different phases of the oscillator signals by the second frequency;

a first phase detector that compares the translated frequency to a reference frequency; a first filter having an output that is connected to the adjustment input of the first oscillator and provides a filtered version of the first phase detector comparison to adjust the first oscillator;

a second phase detector that compares one of the phase signals of the first oscillator to the input frequency, said one of the phase signals being the filtered output of the circuit;

a second filter having an output that provides a filtered version of the second phase detector; and a second oscillator that generates the second frequency in response to the output of the second filter.

* * * * *